United States Patent [19]
Oya et al.

[11] Patent Number: 5,920,242
[45] Date of Patent: Jul. 6, 1999

[54] MULTIELEMENT-TYPE PIEZOELECTRIC FILTER WITH THROUGH-HOLE CONNECTION OF RESONATORS TO A BASE SUBSTRATE CIRCUIT

[75] Inventors: Kanji Oya, Aichi; Eiji Ozeki; Kazuhiro Hayashi, both of Mie, all of Japan

[73] Assignee: NGK Spark Plug Co., Ltd., Nagoya, Japan

[21] Appl. No.: 09/093,306

[22] Filed: Jun. 9, 1998

[30]   Foreign Application Priority Data

Jun. 9, 1997  [JP]  Japan .................................. 9-167973
Jun. 9, 1997  [JP]  Japan .................................. 9-167974

[51] Int. Cl.⁶ .................................................. H03H 9/60
[52] U.S. Cl. .......................... 333/189; 310/352; 174/52.3; 174/262; 174/264; 361/777; 361/792
[58] Field of Search ................... 333/189, 187, 333/190, 192; 310/321, 345, 348, 352, 366; 174/52.3, 262, 264, 265; 361/736, 752, 760, 767, 777, 792

[56]   References Cited

U.S. PATENT DOCUMENTS

| | | | |
|---|---|---|---|
| 4,323,865 | 4/1982 | Tanaka et al. ....................... | 333/190 X |
| 4,639,698 | 1/1987 | Nishiki ................................ | 333/189 X |
| 5,438,305 | 8/1995 | Hikita et al. ........................ | 333/193 X |
| 5,565,824 | 10/1996 | Nagano ............................... | 310/348 X |
| 5,801,603 | 9/1998 | Yamamoto et al. .................... | 333/189 |

*Primary Examiner*—Robert Pascal
*Assistant Examiner*—Barbara Summons
*Attorney, Agent, or Firm*—Sughrue, Mion, Zinn, Macpeak & Seas, PLLC

[57]   ABSTRACT

A multielement-type piezoelectric filter capable of facilitating assembly and having a reduced size. The base substrate carries a conduction circuit. An input terminal portion, an output terminal portion and a ground terminal portion are formed on a bottom surface of the base substrate and connected to corresponding connection end portions of the conduction circuit. Furthermore, series resonators and parallel resonators are arranged side by side on the base substrate. The lower electrodes of the resonators are connected to the corresponding connection end portions of the conduction circuit via through-holes. In one embodiment, conductive sheets are attached onto exposed upper electrodes of some of the resonators so as to establish a required connection between the upper electrodes. In another embodiment, a common path layer is formed on the upper surface of the base substrate. The upper electrodes of some of the resonators are connected to the common path layer via bonding wires. A cap is attached to the base substrate which covers the resonators.

10 Claims, 18 Drawing Sheets

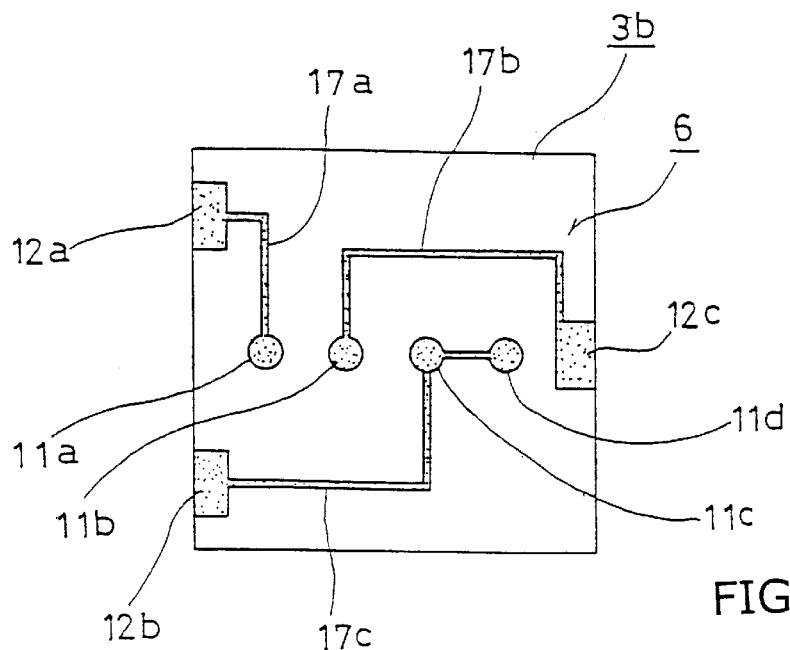
FIG. 4A
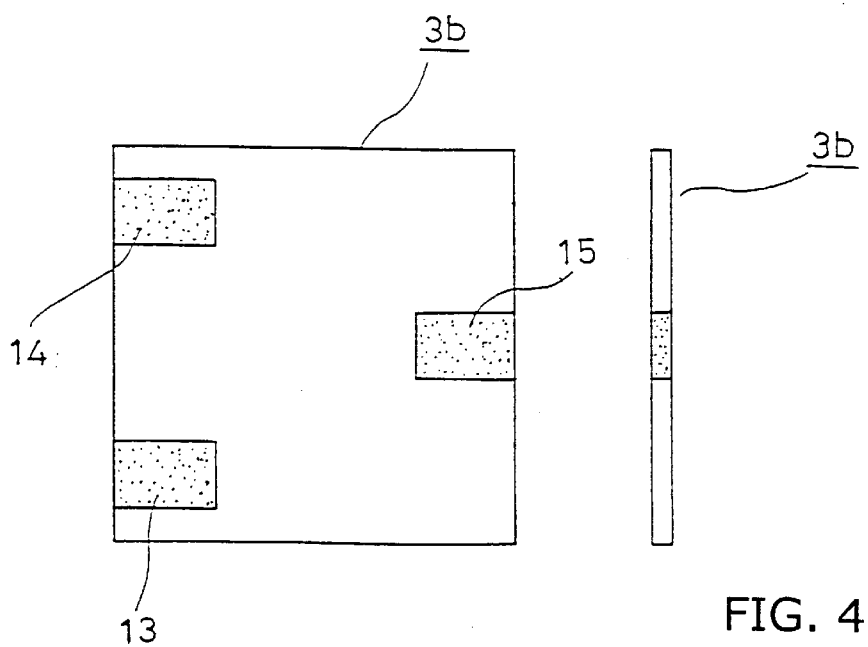
FIG. 4B
FIG. 4C

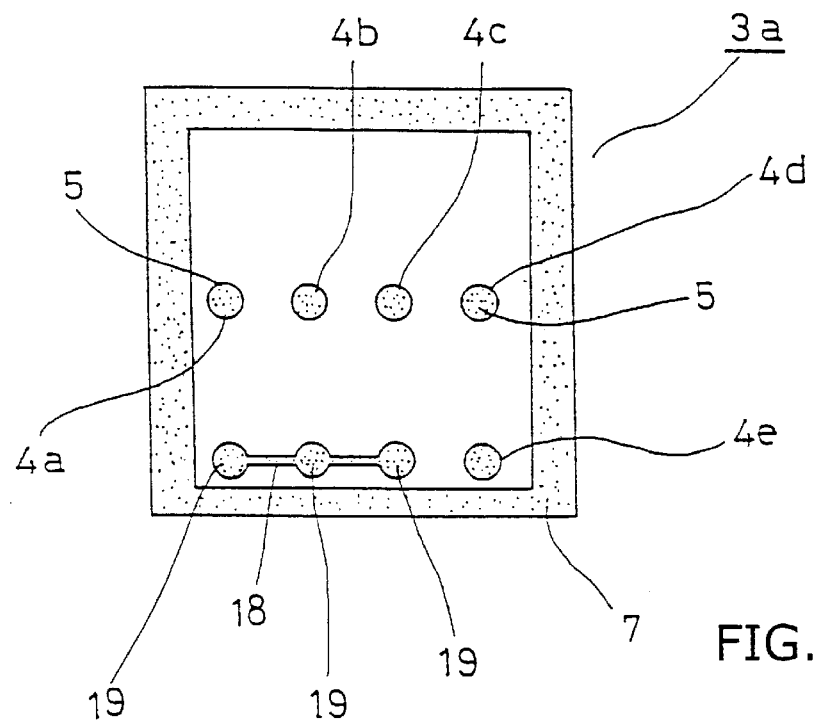
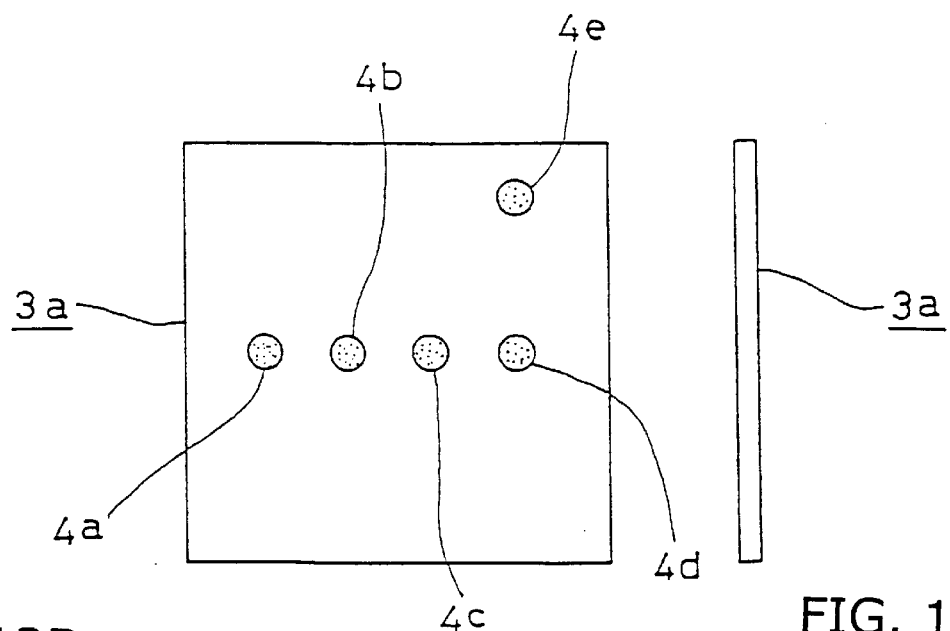
FIG. 12A
FIG. 12B
FIG. 12C

MULTIELEMENT-TYPE PIEZOELECTRIC FILTER WITH THROUGH-HOLE CONNECTION OF RESONATORS TO A BASE SUBSTRATE CIRCUIT

BACKGROUND OF THE INVENTION

1. Field of the Invention

The present invention relates to a ladder-type piezoelectric filter for use in the filter circuits of mobile radio communication units such as portable mobile radio communication units and cellular telephones, and more particularly, to a multielement-type piezoelectric filter well adapted for use in digital communication applications.

2. Description of the Related Art

Conventionally, a piezoelectric filter of this kind comprises unit filter circuits arranged in multiple stages and which are connected to an input terminal, an output terminal and a ground terminal. Each of the unit filter circuits includes a series resonator and a parallel resonator connected in an L-form. The series resonators have the same resonance frequency, while the parallel resonators have the same anti-resonance frequency. Also, the difference between the resonance frequency and the anti-resonance frequency is made constant. In order to improve the characteristics of a piezoelectric filter or to reduce the number of piezoelectric filters employed, various multielement-type piezoelectric filters have been proposed having a plurality of resonators.

According to a conventional configuration of the above-noted multielement-type piezoelectric filter, resonators and terminal boards are arranged in layers within a case. Accordingly, the number of components is relatively large, and assembly of the components is rather complex. To cope with a tendency in size reduction of mobile radio communication units, there is a need to reduce the height and size of such piezoelectric filters to dimensions on the order of millimeters. Furthermore, piezoelectric filters must be configured such that an electrical connection can be easily established between the piezoelectric filters and corresponding conductive paths on a printed wiring board. The piezoelectric filters must also be configured such that conductive paths other than terminals for connection with external conductive paths are not exposed in order to prevent electrical short circuits.

In order to reduce the overall thickness of a piezoelectric filter despite the use of a plurality of resonators, Japanese Patent Application Laid-Open (kokai) No. 8-8677 discloses the following configuration: a conduction circuit is formed on a connection substrate; a series resonator and a parallel resonator are mounted on the corresponding connection end portions of the conduction circuit such that lower electrodes of the resonators are connected to the corresponding connection end portions; upper electrodes of the resonators are interconnected by means of bonding wires; and a cap is attached onto the connection substrate. In such a configuration, conductive paths are exposed on the connection substrate, and thus satisfactory insulation protection is not established. Consequently, despite attachment of the cap onto the connection substrate, the bonding wire may contact the conductive path, or moisture may enter the interior of the cap to cause a short circuit. Furthermore, the use of bonding wires makes the connection work complex. Also, the connection substrate must have a region in which the resonators are disposed and a circuit region for establishing the required electrical connection without causing electrical interference with the resonators. Consequently, the plane area of the connection substrate becomes large with a resultant increase in filter size. Moreover, because the resonators are directly mounted on the conduction circuit, and the lower electrodes of the resonators and the corresponding conductive paths contact each other in a crossing manner, point contact cannot be established between the lower electrodes and the connection end portions of the conduction circuit. As a result, a favorable amplitude cannot be obtained.

SUMMARY OF THE INVENTION

It is therefore an object of the present invention to provide a multielement-type piezoelectric filter capable of solving the above problems of the prior art.

To achieve the above objective, a first aspect of the present invention provides a multielement-type piezoelectric filter comprising:

a base substrate comprising upper and lower connection substrates stacked atop one another; a conduction circuit having connection end portions formed on a mating surface of the upper and lower connection substrates; an input terminal portion, an output terminal portion and a ground terminal portion formed on a bottom surface of the base substrate and connected to corresponding connection end portions of the conduction circuit;

series resonators and parallel resonators having lower and upper electrodes arranged side by side on the base substrate, wherein the lower electrodes are connected to corresponding connection end portions of the conduction circuit via through-holes containing a conductive material formed in the upper connection substrate;

a flexible conductive sheet attached to exposed upper electrodes of some of the resonators so as to establish a required connection between the upper electrodes; and a cap attached onto the base substrate which covers the resonators.

In the present invention, a flexible printed thin sheet, metal foil, or the like can be used as the flexible conductive sheet.

In the above first aspect of the present invention, the conduction circuit is disposed between the two connection substrates and thus is not exposed, to thereby provide reliable electrical insulation. Also, because there is no need to prepare a separate region on the upper surface of the base substrate for use as a circuit region for establishing the required electrical connection, the plane area of the base substrate decreases, thereby reducing the size of the piezoelectric filter. Furthermore, because the through-holes contact the corresponding resonators at their node positions, point contact is established at the node positions between the resonators and the corresponding connection end portions of the conduction circuit. As a result, a favorable amplitude can be obtained.

A second aspect of present invention further provides a multielement-type piezoelectric filter comprising:

a base substrate formed of a single connection substrate including a conduction circuit having connection and portions, an input terminal portion, an output terminal portion and a ground terminal portion formed on a reverse side of the base substrate, wherein said input, output and ground terminal portions are connected to corresponding connection end portions of the conduction circuit;

series resonators and parallel resonators having lower and upper electrodes arranged side by side on an obverse side of the base substrate, wherein the lower electrodes are connected to corresponding connection end portions of the conduction circuit via through-holes containing a conductive material formed in the base substrate;

a flexible conductive sheet attached to exposed upper electrodes of some of the resonators so as to establish a required connection between the upper electrodes;

an insulating coating layer for covering the conduction circuit provided on the reverse side of the base substrate; and a cap attached to the base substrate which covers the resonators.

In the above-described configuration, the conduction circuit, as well as the input terminal portion, the output terminal portion and the ground terminal portion are provided on a reverse side of the base substrate which is formed of a single connection substrate, while the input output and ground terminals are connected to the corresponding connection end portions of the conduction circuit. Accordingly, a mere single substrate will suffice. Furthermore, the conduction circuit provided on the reverse side of the base substrate is covered with an insulating coating layer, thereby providing electrical insulation and mechanical protection. Also, because there is no need to prepare a separate region on the upper surface of the base substrate for use as a circuit region for establishing the requisite electrical connection, the plane area of the base substrate decreases, thereby reducing the size of the piezoelectric filter. Furthermore, because the through-holes contact the corresponding resonators at node positions, point contact is established at the node positions between the resonators and the corresponding connection end portions of the conduction circuit. As a result, a favorable amplitude can be obtained.

The series resonators and the parallel resonators, which are arranged side by side on the base substrate, differ in thickness. As a result, the upper electrodes of the series resonators differ in height from those of the parallel resonators, thereby causing difficulty in establishing an electrical connection therebetween. Thus, preferably, a flexible conductive sheet is attached onto the exposed upper electrodes of the resonators such that the flexible conductive sheet is bent in accordance with the difference in height between the series resonators and the parallel resonators, so as to establish the requisite electrical connection between the upper electrodes.

Alternatively, two parallel resonators, each having approximately half the thickness of each of the series resonators, are stacked atop one another so as to obtain a total height which is substantially equal to the height of each of the series resonators. The thus-stacked parallel resonators and the series resonators are arranged side by side, and a flexible conductive sheet is attached onto the exposed upper electrodes of the resonators so as to establish the requisite connection between the upper electrodes.

A third aspect of the present invention provides a multielement-type piezoelectric filter comprising:

a base substrate comprising upper and lower connection substrates stacked atop one another; a conduction circuit having connection end portions formed on a mating surface of the upper and lower connection substrates; an input terminal portion, an output terminal portion and a ground terminal portion formed on a bottom surface of the base substrate and connected to corresponding connection end portions of the conduction circuit;

series resonators and parallel resonators having lower and upper electrodes arranged side by side on the base substrate, wherein the lower electrodes are connected to corresponding connection end portions of the conduction circuit via through-holes containing a conductive material formed in the upper connection substrate;

a common path layer having connection points formed on an upper surface of the base substrate, the upper electrodes of some of the resonators being electrically connected to connection points of the common path layer via bonding wires so as to establish a mutual connection between these upper electrodes; and a cap attached to the base substrate which covers the resonators.

In the above-described configuration, the conduction circuit is disposed between the two connection substrates and thus is electrically insulated, to thereby improve circuit reliability. Also, because there is no need to prepare a separate region on the upper surface of the base substrate for use as a circuit region for establishing the required electrical connection, the plane area of the base substrate decreases, thereby reducing the size of the piezoelectric filter. Furthermore, because the through-holes contact the corresponding resonators at their node positions, point contact is established at the node positions between the resonators and the corresponding connection end portions of the conduction circuit. As a result, a favorable amplitude can be obtained. Moreover, because only the common path layer and the through-holes are formed on the base substrate, electrical short circuits do not occur even when the bonding wire droops and contacts the base substrate.

A fourth aspect of the present invention further provides a multielement-type piezoelectric filter comprising:

a base substrate formed of a single connection substrate and including a conduction circuit having connection end portions, an input terminal portion, an output terminal portion and a ground terminal portion formed on a reverse side of the base substrate, wherein said input, output and ground terminal portions are connected to corresponding connection end portions of the conduction circuit;

series resonators and parallel resonators having lower and upper electrodes arranged side by side on an obverse side of the base substrate, wherein the lower electrodes are connected to corresponding connection end portions of the conduction circuit via through-holes containing a conductive material formed in the base substrate;

a common path layer having connection points formed on the obverse surface of the base substrate, the upper electrodes of some of the resonators being electrically connected to connection points of the common path layer via bonding wires so as to establish a mutual connection between these upper electrodes;

an insulating coating layer for covering the conduction circuit provided on the reverse side of the base substrate; and a cap attached to the base substrate which covers the resonators.

In the above-described configuration, the conduction circuit, as well as the input terminal portion, the output terminal portion and the ground terminal portion are provided on the reverse side of the base substrate which is formed of a single connection substrate, while the input, output and ground terminals are connected to the corresponding connection end portions of the conduction circuit. Accordingly, a mere single substrate will suffice. Furthermore, the conduction circuit provided on the reverse side of the base substrate is covered with an insulating coating layer, thereby providing electrical insulation and mechanical protection. Also, because there is no need to prepare a separate region on the upper surface of the base substrate for use as a circuit region for establishing the requisite electrical connection, the plane area of the base substrate decreases, thereby reducing the size of the piezoelectric filter. Furthermore, because the through-holes contact the corresponding resonators at node positions, point contact is established at the node positions between the resonators and the corresponding connection end portions of the conduction circuit. As a result, a favorable amplitude can be obtained.

The third and fourth aspects of the present invention further provide a structure in which the upper electrodes of some of the resonators are electrically connected to connection points of the common path layer via bonding wires, the upper electrode of a resonator other than those resonators having an upper electrode electrically connected to a connection point of the common path layer is electrically connected via a bonding wire to an additional through-hole containing a conductive material formed in the base substrate, and said connection points of the common path layer and said additional through-hole are disposed in line along the resonators at a constant interval.

In this configuration, the connection positions of the bonding wires on the resonators and the connection positions at the other ends are located at constant intervals and at the same widthwise positions. Accordingly, when the bonding wires are mechanically soldered using a wire connection apparatus, rotation of the upper connection substrate or base substrate is not required. Instead, the bonding wires can be successively joined to the electrodes and the common path layer in the same posture while the upper connection substrate or base substrate is intermittently fed in one direction. Therefore, the working efficiency is improved.

BRIEF DESCRIPTION OF THE DRAWINGS

FIG. 4A is a plan view of the lower connection substrate of FIG. 2;

FIG. 4B is a bottom view of the lower connection substrate of FIG. 2;

FIG. 4C is a side view of the lower connection substrate of FIG. 2;

FIG. 12A is a plan view of the upper connection substrate of FIG. 11;

FIG. 12B is a bottom view of the upper connection substrate of FIG. 11;

FIG. 12C is a side view of the upper connection substrate of FIG. 11;

DESCRIPTION OF THE PREFERRED EMBODIMENTS

First, a detailed description of the first and second aspects of the present invention is given below as follows.

Figure 1:
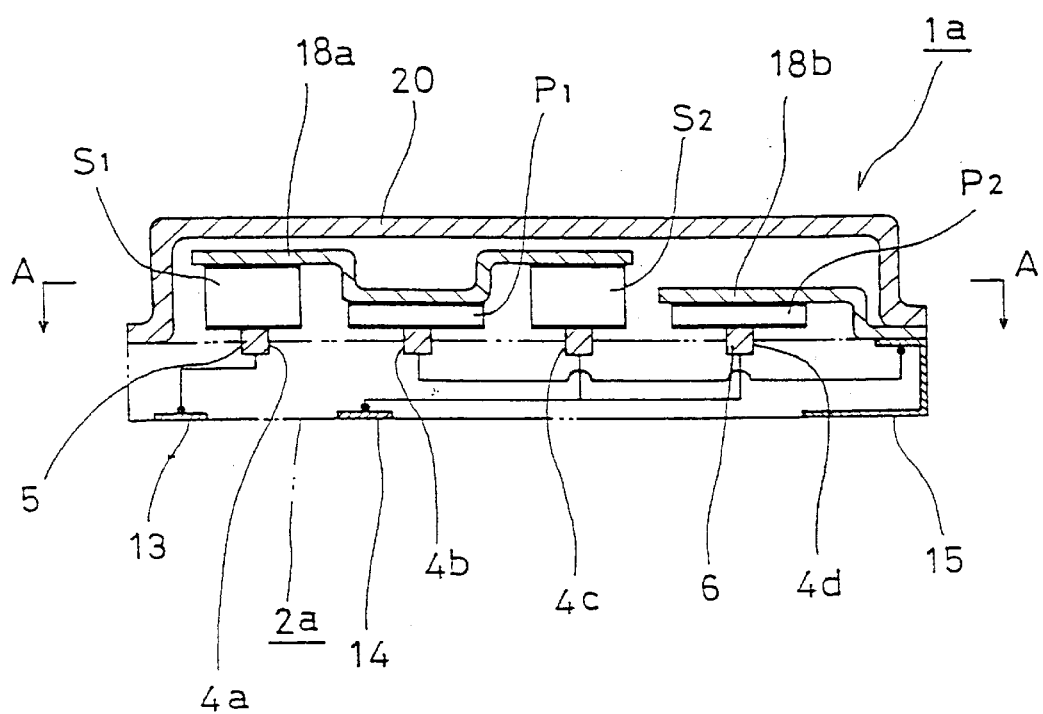
FIG. 1 is a schematic view showing a multielement-type piezoelectric filter according to a first embodiment of the present invention.
Figure 2:
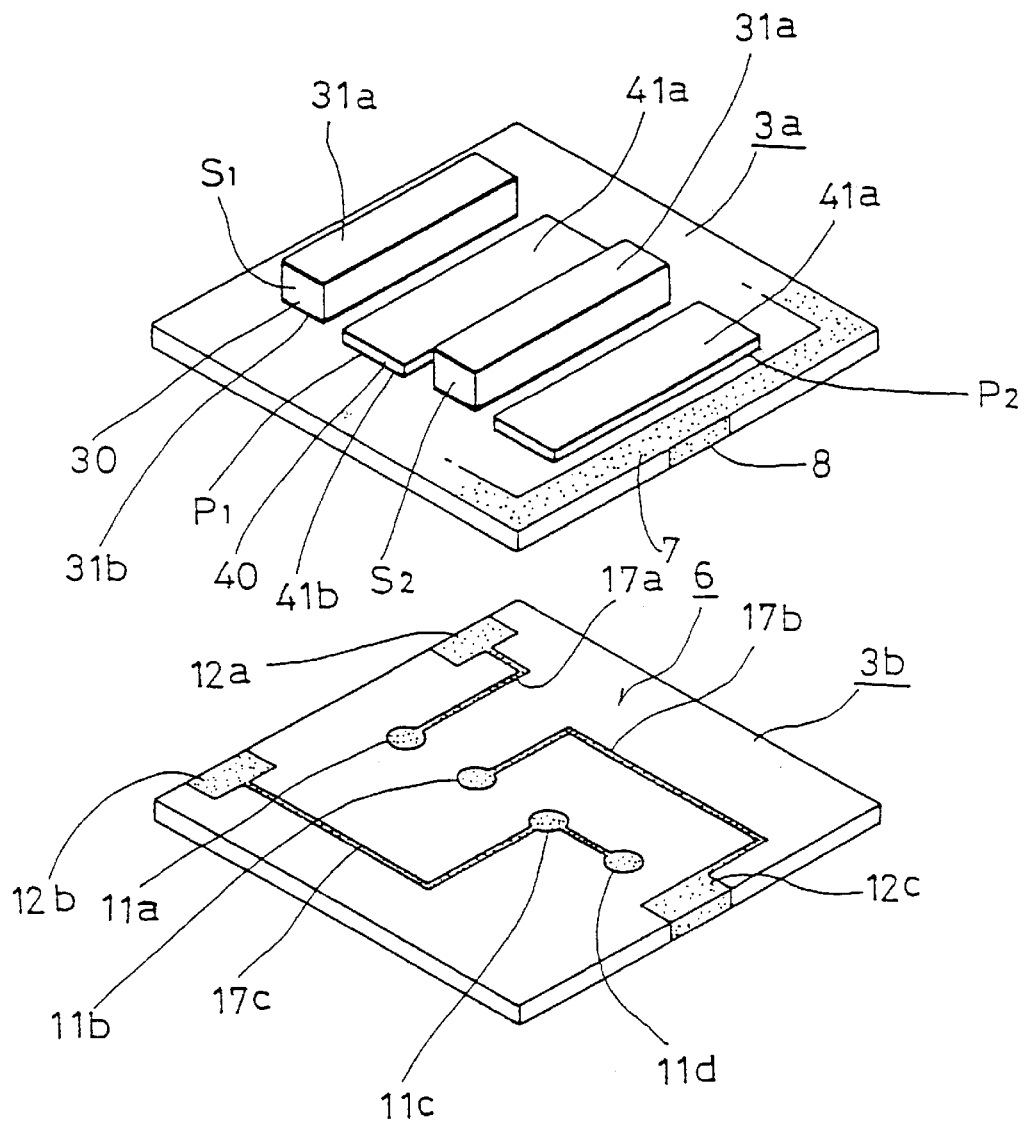
FIG. 2 is a perspective exploded view showing an upper connection substrate carrying resonators and a lower connection substrate.
Figure 5:
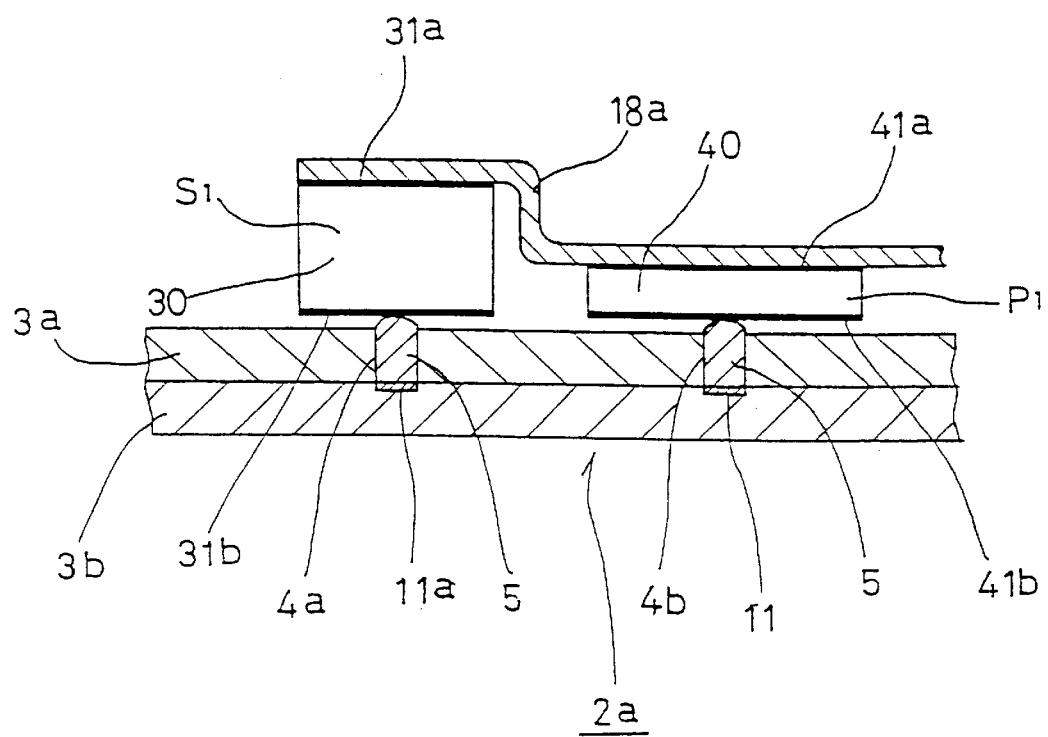
FIG. 5 is a partial vertical cross section of the multielement-type piezoelectric filter of FIG. 1.

FIG. 1 shows a piezoelectric filter $1a$ according to a first embodiment of the present invention. Two series resonators $S_1$ and $S_2$ and two parallel resonators $P_1$ and $P_2$ are disposed on a base substrate $2a$. A cap 20 is attached to the base substrate $2a$ from above so as to hermetically cover the resonators $S_1$, $S_2$, $P_1$ and $P_2$. The base substrate $2a$, shown schematically in FIG. 1, is formed by stacking the connection substrate $3a$ shown in FIGS. 3A–3C atop of the connection substrate $3b$ shown in FIGS. 4A–4C, as shown in FIGS. 2 and 5.

Figure 18:
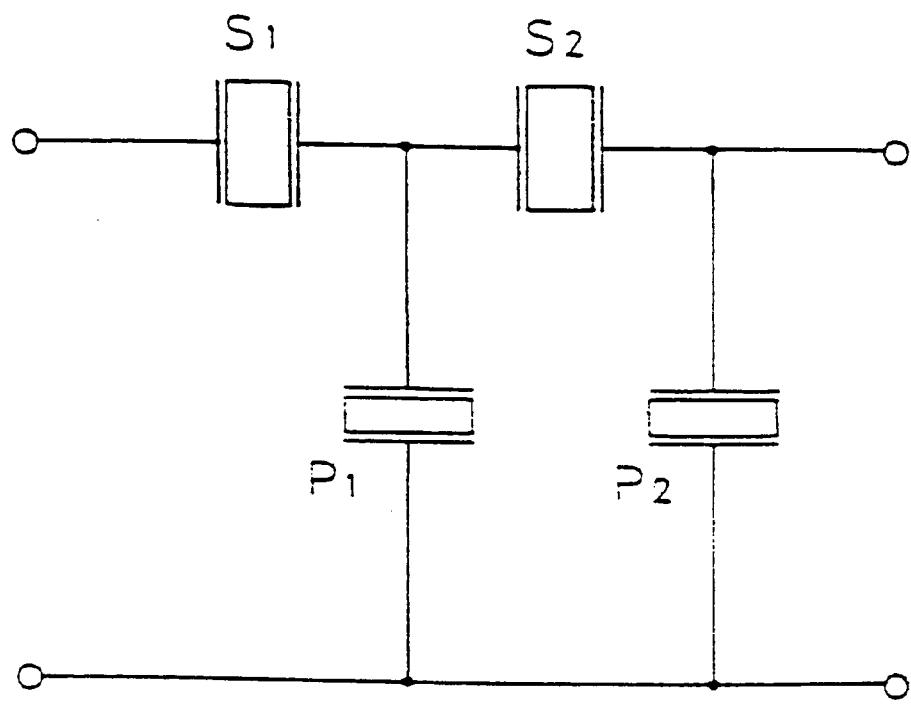
FIG. 18 is an equivalent circuit diagram according to the various embodiments of the present invention.

As shown in FIG. 18, the piezoelectric filter $1a$ includes unit filter circuits arranged in two stages, one of which is composed of the series resonator $S_1$ and the parallel resonator $P_1$ connected in the form of the letter L, and the other of which is composed of the series resonator $S_2$ and the parallel resonator $P_2$ also connected in the form of the letter L. The configuration of the piezoelectric filter $1a$ will next be described in detail.

Figure 3A:
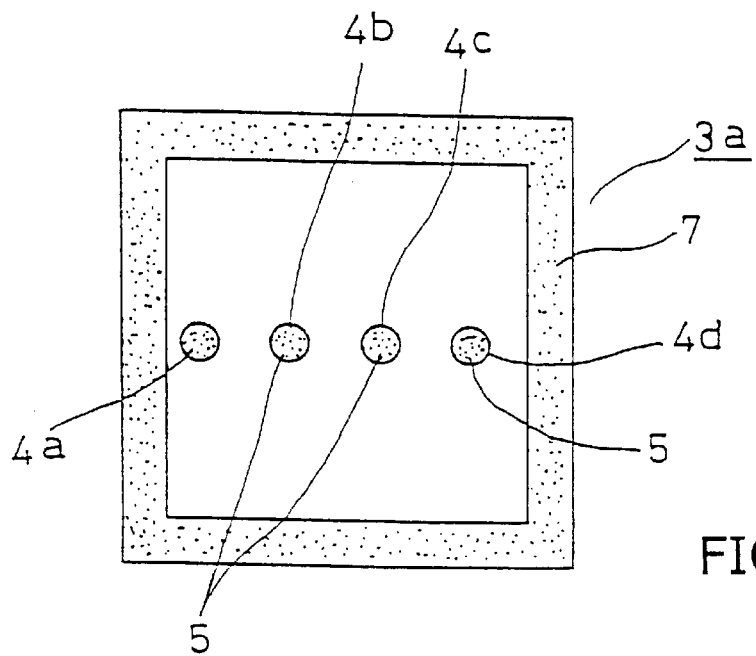
FIG. 3A is a plan view of the upper connection substrate of FIG. 2.
Figures 3B, 3C:
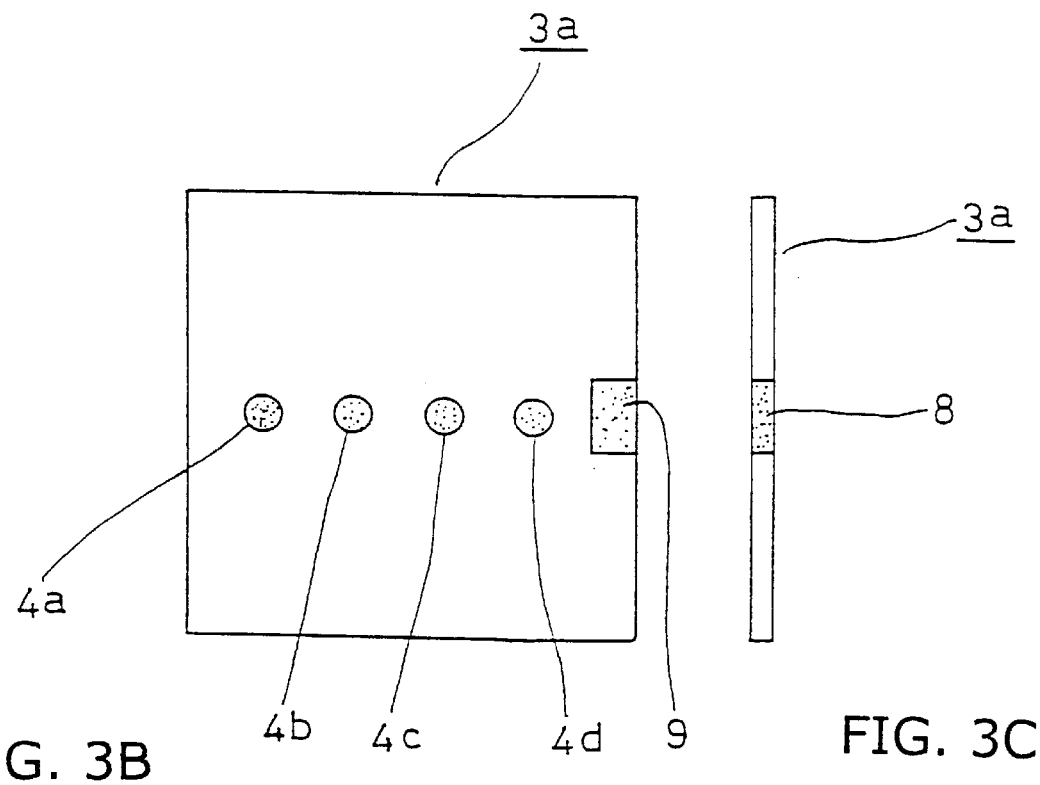
FIG. 3B is a bottom view of the upper connection substrate of FIG. 2.
FIG. 3C is a side view of the upper connection substrate of FIG. 2.

As shown in FIGS. 3A–3C, the upper connection substrate $3a$ of the base substrate $2a$ is formed of a 6 mm×6 mm square insulating substrate having a thickness of about 0.3 mm. Four through-holes $4a$, $4b$, $4c$ and $4d$ are formed in the upper connection substrate $3a$ and arranged in line. The through-holes $4a$, $4b$, $4c$ and $4d$ are filled with conductive material 5 such that the conductive material 5 slightly projects from the surface of the upper connection substrate $3a$ as shown in FIG. 5 to thereby establish point contact with a lower electrode of each resonator at the node position of the electrode.

A conductive edge portion 7, which is formed of a conductive material having a width of about 0.6 mm, is formed on the surface of the upper connection substrate 3a along four side edges of the substrate. The conductive edge portion 7 is connected to a connection path portion 9 formed on the reverse side of the upper connection substrate 3a via a conduction portion 8 formed on the side edge of the upper connection substrate 3a.

As shown in FIGS. 4A–4C, a conduction circuit 6 is formed on the surface of the lower connection substrate 3b in order to connect to the resonators in a required form. Specifically, four spot-like connection end portions 11a, 11b, 11c and 11d are formed in line at the central portion of the lower connection substrate 3b for connection with the through-holes 4a, 4b, 4c and 4d. The connection end portions 11c and 11d are interconnected by means of a thin conductive path. A rectangular input-side conductive edge portion 12a, a rectangular output-side conductive edge portion 12b, and a rectangular ground-side conductive edge portion 12c are formed at the side edge portions of the lower connection substrate 3b. The connection end portion 11a is connected to the input-side conductive edge portion 12a via a thin connection path 17a; the connection end portion 11b is connected to the ground-side conductive edge portion 12c via a thin connection path 17b; and the connection end portions 11c and 11d are connected to the output-side conductive edge portion 12b via a thin connection path 17c. Thus, the conduction circuit 6 is formed on the obverse surface of the lower connection substrate 3b.

On the reverse side of the lower connection substrate 3b, an input terminal portion 13 and an output terminal portion 14 are formed along one side edge of the lower connection substrate 3b, and a ground terminal portion 15 is formed along the opposite side edge of the lower connection substrate 3b. The input terminal portion 13, the output terminal portion 14, and the ground terminal portion 15 extend toward the obverse side of the lower connection substrate 3b along the respective side edges and merge with the input-side conductive edge portion 12a, the output-side conductive edge portion 12b, and the ground-side conductive edge portion 12c, respectively. Thus, the connection end portion 11a is connected to the input terminal portion 13 via the thin connection path 17a and the input-side conductive edge portion 12a; the connection end portion 11b is connected to the ground terminal portion 15 via the thin connection path 17b and the ground-side conductive edge portion 12c; and the connection end portions 11c and 11d are connected to the output terminal portion 14 via the thin connection path 17c and the output-side conductive edge portion 12b.

The thus-configured upper and lower connection substrates 3a and 3b, respectively, are stacked atop one another. As a result, the through-hole 4a is connected to the input terminal portion 13 via the connection end portion 11a; the through-hole 4b is connected to the ground terminal portion 15 via the connection end portion 11b; and the through-holes 4c and 4d are connected to the output terminal portion 14 via the connection end portions 11c and 11d. Furthermore, the conductive edge portion 7 is connected to the ground terminal portion 15 through the surface contact between the connection path portion 9 and the ground-side conductive edge portion 12c.

Figure 6:
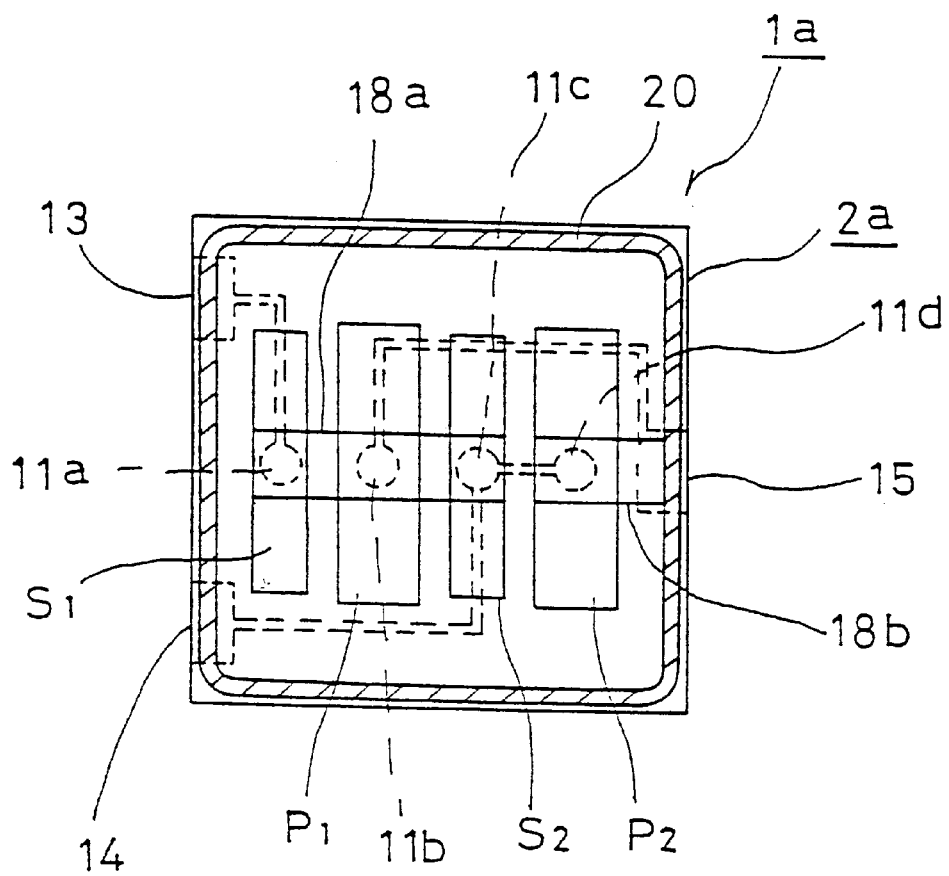
FIG. 6 is a horizontal cross section taken along line A—A of FIG. 1.

As shown in FIGS. 2 and 6, the series resonators $S_1$ and $S_2$ and the parallel resonators $P_1$ and $P_2$ are disposed in line on the base substrate 2a having the above-described structure such that the series resonators $S_1$ and $S_2$ are located on the through-holes 4a and 4c, respectively, and the parallel resonators $P_1$ and $P_2$ are located on the through-holes 4b and 4d, respectively.

Each of the series resonators $S_1$ and $S_2$ includes a strip-like piezoelectric ceramic plate 30 formed of lead zirconate titanate or the like and having a predetermined thickness, and electrodes 31a (hereinafter referred to as upper electrode 31a) and 31b (hereinafter referred to as lower electrode 31b) provided on the obverse and reverse sides, respectively, of the piezoelectric ceramic plate 30. As in the case of the series resonators $S_1$ and $S_2$, each of the parallel resonators $P_1$ and $P_2$ includes a strip-like piezoelectric ceramic plate 40 formed of lead zirconate titanate or the like and electrodes 41a (hereinafter referred to as upper electrode 41a) and 41b (hereinafter referred to as lower electrode 41b) provided on the obverse and reverse sides, respectively, of the piezoelectric ceramic plate 40. The parallel resonators $P_1$ and $P_2$ are made thinner than the series resonators $S_1$ and $S_2$ to thereby provide a larger capacitance. As a result, the ratio of the capacitance of the parallel resonators $P_1$ and $P_2$ to that of the series resonators $S_1$ and $S_2$ becomes large, to thereby increase the degree of attenuation.

The conductive material 5 filled in each of the through-holes 4a, 4b, 4c and 4d is projected upward. Thus, as shown in FIG. 5, the conductive material 5 establishes point contact with each of the lower electrodes 31b and 41b at a node position corresponding to the central position of the corresponding resonator. A fine gap is formed between the remaining region of the lower electrode 31b (41b) and the surface of the base substrate 2a. Accordingly, efficient resonance is ensured.

Furthermore, a flexible conductive sheet 18a is attached onto the series resonator $S_1$, the parallel resonator $P_1$ and the series resonator $S_2$ so as to establish the same electrical potential among the upper electrodes 31a, 41a and 31a of the resonators $S_1$, $P_1$ and $S_2$, respectively. The flexible conductive sheet 18a is formed of a flexible printed thin sheet, which is composed of an insulating thin sheet and a conductive layer formed on the contact-surface side of the insulating thin sheet, metal foil, or the like. Also, a flexible conductive sheet 18b is attached onto the upper electrode 41a of the parallel resonator $P_2$ and the ground-side conductive edge portion 12c. Because the series resonators $S_1$ and $S_2$ differ in thickness from the parallel resonator $P_1$ as discussed above, the upper electrodes 31a of the series resonators $S_1$ and $S_2$ differ in height from the upper electrode 41a of the parallel resonator $P_1$. As a result, the upper electrodes 31a are not flush with the upper electrode 41a. Thus, the flexible conductive sheet 18a is bent as shown in FIG. 1 so as to reliably establish surface contact with the upper electrodes 31a and 41a. Likewise, the flexible conductive sheet 18b is bent so as to cope with the difference in height between the upper electrode 41b of the parallel resonator $P_2$ and the ground-side conductive edge portion 12c, to thereby reliably establish surface contact with the respective conductive surfaces.

After the above-mentioned connections are made, the cap 20 is attached onto the base substrate 2a such that the lower end of a peripheral wall of the cap 20 is bonded to the peripheral portion of the upper surface of the base substrate 2a, thereby hermetically sealing the interior of the cap. In this case, the flexible conductive sheet 18b may be pressed from above by the lower end of the peripheral wall so as to reliably hold the flexible conductive sheet 18b. Alternatively, a cut may be formed in the lower end of the peripheral wall of the cap 20 at a position corresponding to the flexible conductive sheet 18b so as to evade the flexible conductive sheet 18b.

The above-described configuration is represented by the equivalent circuit of FIG. 18. That is, a two-stage filter circuit is formed in which the series resonator $S_1$ and the parallel resonator $P_1$ are connected in the form of the letter L, and in which the series resonator $S_2$ and the parallel resonator $P_2$ are connected in the form of the letter L. Specifically, the electrodes of the series resonator $S_1$, the parallel resonator $P_1$, and the series resonator $S_2$ which face each other on the equivalent circuit are connected by the flexible conductive sheet 18a. The lower electrode 31b of the series resonator $S_1$ is connected to the input terminal portion 13, which is formed in an exposed state on the lower surface of the base substrate 2a, via the through-hole 4a, the connection end portion 11a, the connection path 17a, and the input-side conductive edge portion 12a. The lower electrodes 31b and 41b of the series resonator $S_2$ and the parallel resonator $P_2$, respectively, are connected to the output terminal portion 14, which is formed in an exposed state on the lower surface of the base substrate 2a, via the through-holes 4c and 4d, the connection end portions 11c and 11d, and the output-side conductive edge portion 12b. The lower electrode 41b of the parallel resonator $P_1$ is connected to the ground terminal portion 15, which is formed in an exposed state on the lower surface of the base substrate 2a, via the through-hole 4b, the connection end portion 11b, and the ground-side conductive edge portion 12c. Likewise, the upper electrode 41a of the parallel resonator $P_2$ is connected to the grounding terminal portion 15 via the flexible conductive sheet 18b, the conductive edge portion 7, the connection path portion 9, and the ground-side conductive edge portion 12c. The two-stage filter circuit of FIG. 18 is configured in this manner.

In the above-described configuration, the conduction circuit 6 is formed on the lower connection substrate 3b. Therefore, even though the resonators are disposed on the upper connection substrate 3a, no conductive path is exposed on the surface of the base substrate 2a, such that the conduction circuit is electrically insulated in a reliable manner. Also, because the conduction circuit 6 for establishing the required electrical connection is formed underneath the region on which the resonators are disposed, there is no need to prepare a separate region for the conduction circuit 6 on the upper surface of the base substrate 2a. Thus, the plane area of the base substrate 2a decreases, thereby reducing the overall size of the piezoelectric filter. Furthermore, the conductive materials 5 projecting from the through-holes 4a, 4b, 4c, and 4d establish point contact with the corresponding resonators at the node positions of the resonators, and the remaining surface of each of the resonators does not contact the base substrate 2a. Thus, a favorable amplitude can be obtained.

The series resonators $S_1$ and $S_2$, which are arranged on the base substrate 2a side by side with the parallel resonators $P_1$ and $P_2$, differ in thickness from the parallel resonators $P_1$ and $P_2$. However, the flexible conductive sheets 18a and 18b are bent in accordance with the difference in height between the resonators so as to establish the required connection between the upper electrodes of the resonators. Accordingly, although there is a difference in thickness, the required connection is easily established between the upper electrodes of the resonators by attaching the flexible conductive sheets 18a and 18b onto the upper electrodes.

The thus-configured piezoelectric filter 1a is mounted on a printed wiring board such that the input terminal portion 13, the output terminal portion 14, and the grounding terminal portion 15, which are exposed on the lower surface of the base substrate 2a, are connected to the corresponding conductive paths formed on the printed wiring board.

Figure 7:
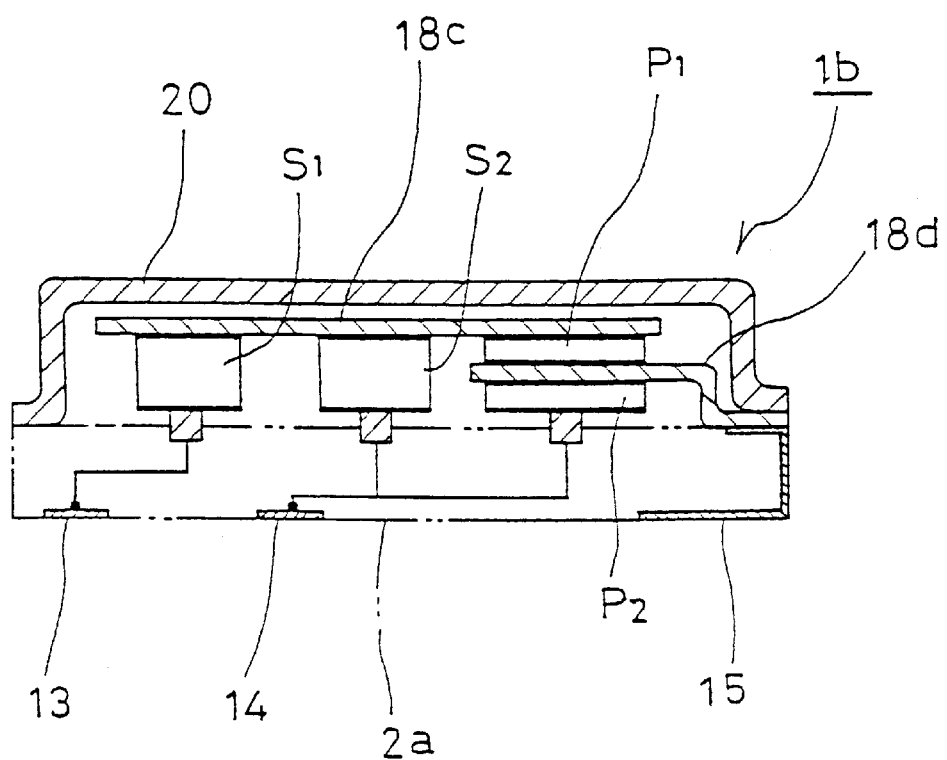
FIG. 7 is a schematic view showing a multielement-type piezoelectric filter according to a second embodiment of the present invention.

FIG. 7 shows a second embodiment of the present invention. In the configuration of the second embodiment, the same features as those of the first embodiment are denoted by common reference numerals, and their description is omitted.

In the configuration of the second embodiment, the thickness of the parallel resonators $P_1$ and $P_2$ is made approximately half the thickness of the series resonators $S_1$ and $S_2$, and the parallel resonators $P_1$ and $P_2$ are stacked atop one another. The upper electrode of the parallel resonator $P_1$ is substantially the same height as the upper electrodes of the series resonators $S_1$ and $S_2$. Thus, when the upper electrodes are connected by means of a conductive sheet 18c, there is no need to bend the conductive sheet 18c, thereby facilitating the connection work. A conductive sheet 18d for grounding is held between the parallel resonators $P_1$ and $P_2$ and connected to the ground-side conductive edge portion 12c as in the case of the first embodiment.

In the above-described configuration, a through-hole corresponding to the through-hole 4b of the first embodiment is not present in the upper connection substrate 3a of the base substrate 2a. Accordingly, the conduction circuit 6 formed on the upper surface of the lower connection substrate 3b does not have a connection end portion and a connection path corresponding to the connection end portion 11b and the connection path 17b, respectively, of the first embodiment. Other features are substantially similar to those of the first embodiment.

In the second embodiment, as described above, there is no need to bend the flexible conductive sheet 18c, and the parallel resonators $P_1$ and $P_2$ are stacked atop one another. Thus, the plane area of the base substrate 2a is significantly reduced, thereby contributing to a reduction in the overall size of the piezoelectric filter 1a.

Figure 8:
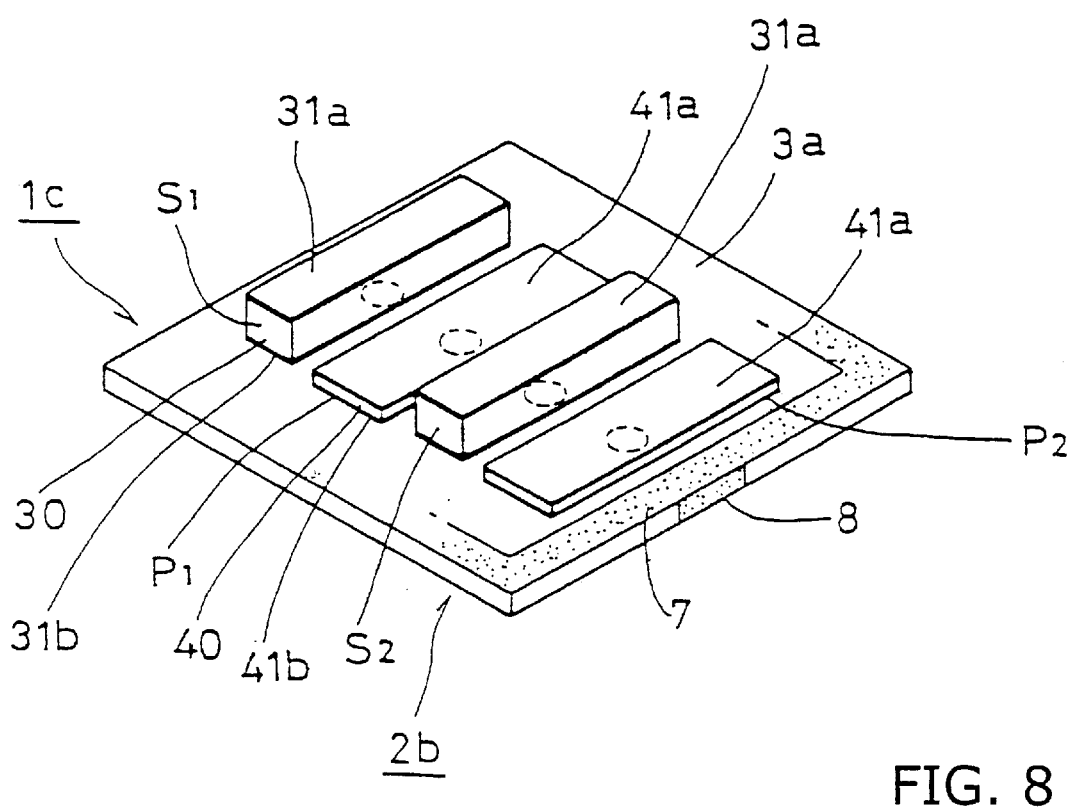
FIG. 8 is a perspective view showing the connection substrate and resonators of a multielement-type piezoelectric filter according to a third embodiment of the present invention.
Figure 9A:
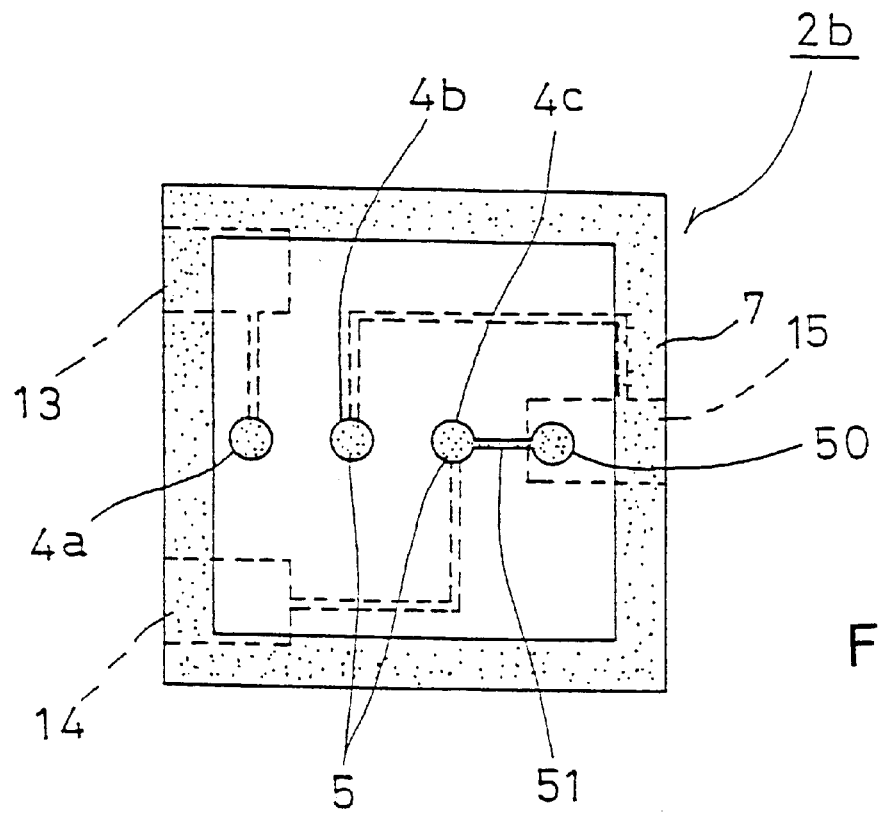
FIG. 9A is a plan view of the base substrate of the multielement-type piezoelectric filter of FIG. 8.
Figure 9B:
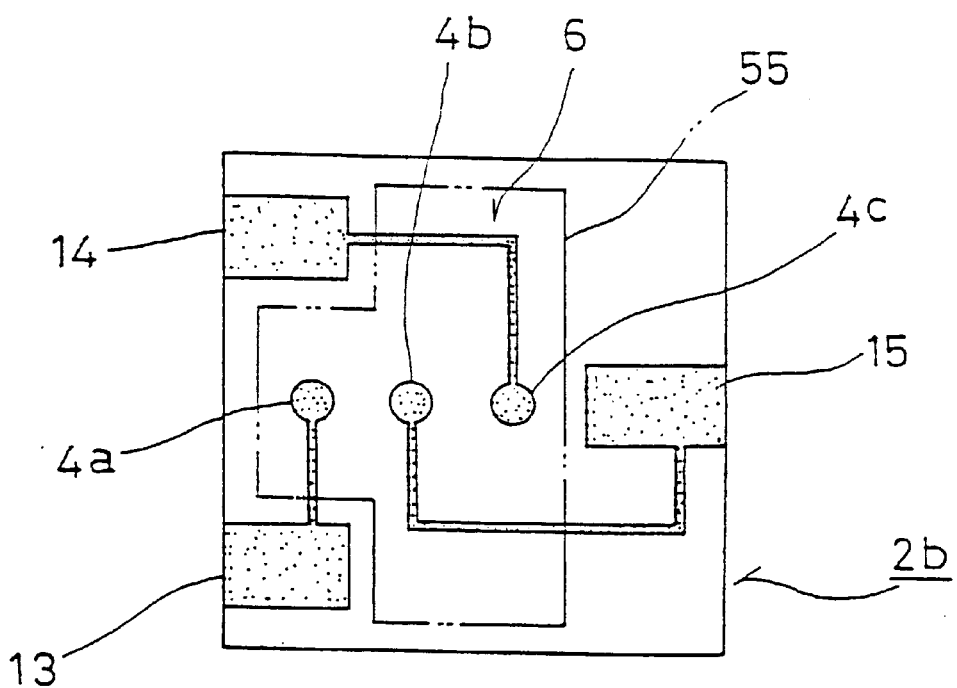
FIG. 9B is a bottom view of the base substrate of the multielement-type piezoelectric filter of FIG. 8.

FIGS. 8, 9A, and 9B show a multielement-type piezoelectric filter 1c which uses a base substrate 2b formed of a single connection substrate. The configuration of the base substrate 2b is basically similar to that of the base substrate 2a described above. The same features as those of the base substrate 2a are denoted by common reference numerals, and their description is omitted.

The configuration of the base substrate 2b will be described with reference to FIGS. 9A and 9B. The base substrate 2b is formed of a square insulating substrate. Three through-holes 4a, 4b and 4c are formed in the base substrate 2b and arranged in line. The through-holes 4a, 4b and 4c are filled with a conductive material. As in the case of FIG. 5, the conductive material slightly projects from the surface of the base substrate 2b. Furthermore, a connection end portion 50 is formed by metallizating the surface of the base substrate 2b apart from the through-hole 4c. The thus-formed connection end portion 50 slightly projects from the surface of the base substrate 2b due to its thickness. Thus, the conductive materials and the connection end portion 50 establish point contact with the corresponding resonators at the node positions of the resonators. The connection end portion 50 is connected to the through-hole 4c by means of a conductive path 51. Also, a conductive edge portion 7 is formed of a conductive material on the base substrate 2b along the four side edges of the base substrate 2b.

On the reverse side of the base substrate 2b, there are formed an input terminal portion 13, an output terminal portion 14, a ground terminal portion 15, and a conduction circuit 6 formed of thin conductive paths. The connection end portions of the thin conductive paths of the conduction circuit 6 are connected to the corresponding terminal portions 13, 14 and 15, while the opposite connection end portions of the thin conductive paths are connected to the corresponding through-holes 4a, 4b and 4c. Thus, via the conduction circuit 6, the through-hole 4a is connected to the input terminal portion 13, the through-hole 4b is connected to the ground terminal portion 15, and the through-hole 4c is connected to the output terminal portion 14. An insulating coating layer 55 is formed so as to cover the conduction circuit 6, thereby insulating the conductive circuit 6 and protecting the conductive circuit 6 by preventing the circuit from being exposed on the lower surface of the base substrate 2b.

As shown in FIG. 8, on the thus-configured base substrate 2b, there are disposed in line the series resonators $S_1$ and $S_2$ and the parallel resonators $P_1$ and $P_2$ such that the series resonators $S_1$ and $S_2$ are located on the through-holes 4a and 4c, respectively, and such that the parallel resonators $P_1$ and $P_2$ are located on the through-hole 4b and the connection end portion 50, respectively.

Furthermore, as in the case of FIG. 1, the flexible conductive sheets 18a and 18b are attached onto the series resonators $S_1$ and $S_2$ and the parallel resonators $P_1$ and $P_2$ so as to establish the required connections. Subsequently, the cap 20 is attached onto the base substrate 2b, thereby forming the two-stage filter circuit of FIG. 18.

Also, the configuration of FIG. 7 using the conductive sheets 18c and 18d may be applied to the present configuration using the base substrate 2b. The resulting configuration is similar to that of the second embodiment of FIG. 7. A conduction circuit similar to that of the second embodiment may be formed on the reverse side of the base substrate 2b, and a detailed description thereof is omitted.

In the above-described configuration which uses the base substrate 2b formed of a single substrate, the structure becomes relatively simple and one connection substrate can be omitted. As a result, cost is reduced, and the height is reduced by the thickness of the omitted substrate.

As described above, in accordance with the above first and second aspects of the present invention, the base substrate 2a (2b) carries the conduction circuit 6. The input terminal portion 13, the output terminal portion 14 and the ground terminal portion 15 are formed on the bottom surface of the base substrate 2a (2b) and are connected to the corresponding connection end portions of the conduction circuit 6. Furthermore, the series resonators $S_1$ and $S_2$ and the parallel resonators $P_1$ and $P_2$ are arranged side by side on the base substrate 2a (2b) in the following manner: the lower electrodes of the resonators are connected to the corresponding connection end portions of the conduction circuit 6 via through-holes; the conductive sheets 18a and 18b (18c and 18d) are attached to the exposed upper electrodes of the resonators so as to establish the required connection between the upper electrodes. Also, the cap is attached onto the base substrate 2a (2b) so as to cover the resonators. Thus, the first and second aspects of the present invention provide the following advantages.

1) In the configuration wherein the two connection substrates 3a and 3b constitute the base substrate 2a and wherein the conduction circuit 6 is disposed between the two connection substrates 3a and 3b, the conduction circuit 6 is completely concealed and is thus electrically insulated in a reliable manner. Therefore, this configuration is free of electrical short circuits which would otherwise occur due to the entry of moisture or the like, thereby improving circuit reliability.

2) In the configuration wherein a single connection substrate constitutes the base substrate 2b, wherein the conduction circuit 6 is disposed on the reverse side of the base substrate 2b and the conduction circuit 6 is covered with the insulating coating layer 55, the structure becomes relatively simple. As a result, one connection substrate is omitted as compared to the configuration of 1), thereby reducing cost and reducing height by the thickness of the omitted substrate.

3) There is no need to prepare a separate circuit region for establishing the required electrical connection on the upper surface of the base substrate. Thus, the plane area of the base substrate decreases, thereby reducing the overall size of the piezoelectric filter.

4) Because the through-holes 4a, 4c, 4b and 4d contact the resonators $S_1$, $S_2$, $P_1$ and $P_2$, respectively, at node positions, point contact is established at the node positions between the resonators and the corresponding connection end portions of the conduction circuit. As a result, a favorable amplitude can be obtained.

5) Because the conductive sheets 18a and 18b (18c and 18d) are attached onto the upper electrodes 31a and 41a of the resonators so as to establish a required connection, connection work is facilitated as compared to the case where bonding wires are used.

In the configuration wherein the flexible conductive sheets 18a and 18b are attached onto the upper electrodes 31a and 41a, the flexible conductive sheets 18a and 18b are bent in accordance with the difference in height, if any, between the series resonators $S_1$ and $S_2$ and the parallel resonators $P_1$ and $P_2$ Therefore, the required connection can be established between the upper electrodes 31a and 41a.

Furthermore, in another configuration the two parallel resonators $P_1$ and $P_2$, each having approximately half the thickness of each of the series resonators $S_1$ and $S_2$, are stacked atop one another so as to obtain a total height which is substantially equal to the height of each of the series resonators $S_1$ and $S_2$. Also, the conductive sheets 18c and 18d are attached to the exposed upper electrodes of the resonators so as to establish the required connection between the upper electrodes. As a result, the conductive sheet 18c does not have to be bent, and the total area of the bonding regions of the resonators can be reduced by an area corresponding to one resonator. Accordingly, the piezoelectric filter can be reduced in plane area and thus in overall size.

Next, a detailed description of the third and fourth aspects of the present invention is given below as follows.

Figure 10:
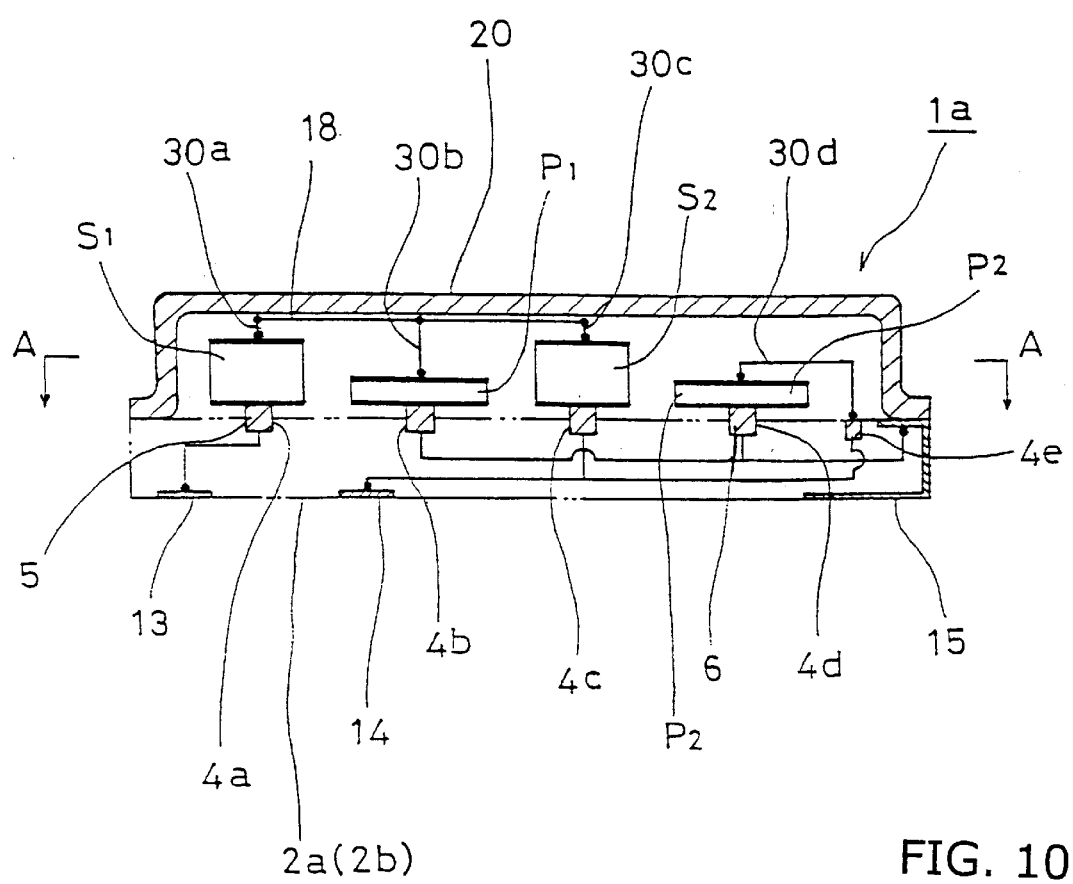
FIG. 10 is a schematic view showing a multielement-type piezoelectric filter according to a fourth embodiment of the present invention.
Figure 11:
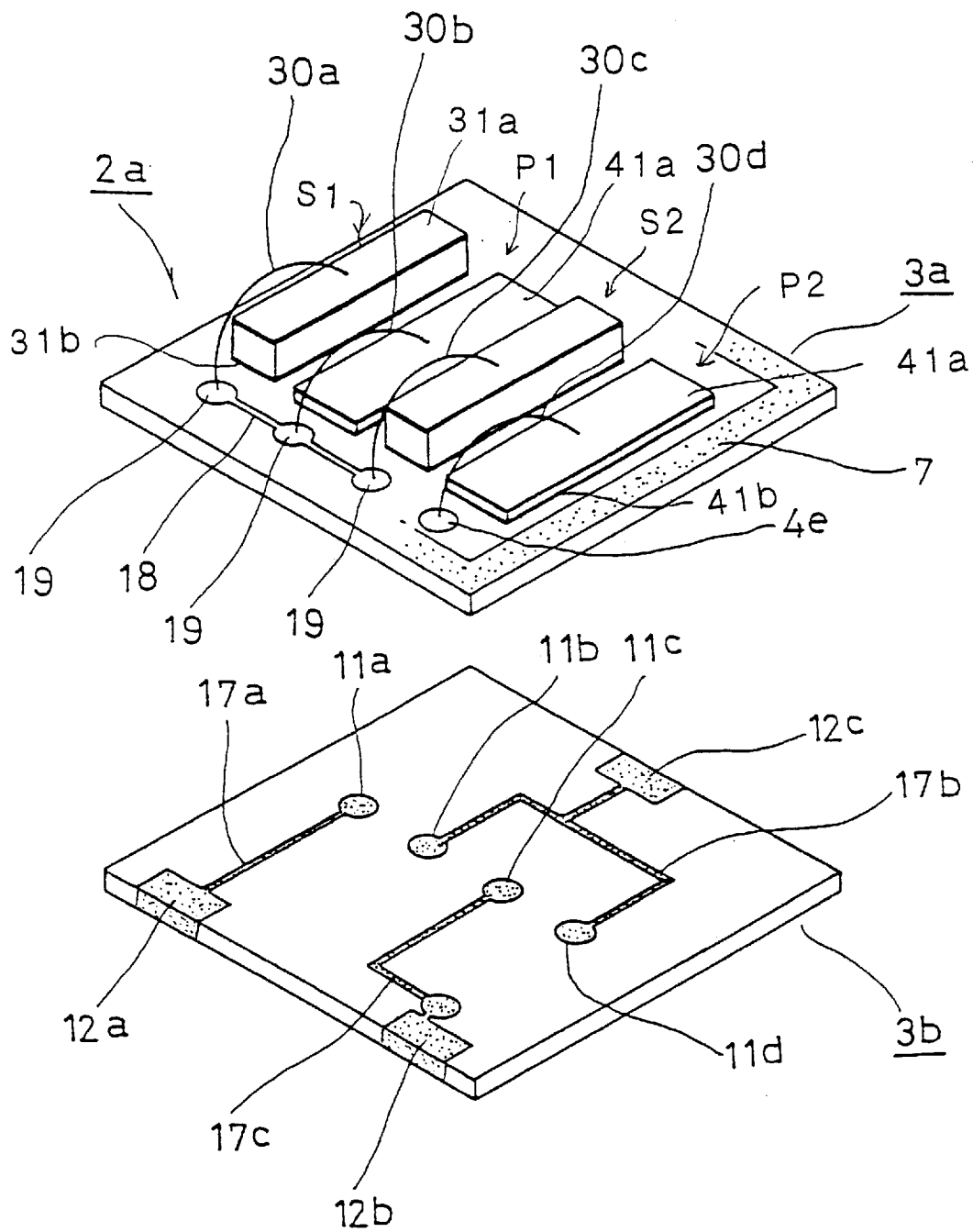
FIG. 11 is a perspective exploded view showing an upper connection substrate carrying resonators and a lower connection substrate.

FIG. 10 shows a piezoelectric filter 1a according to a fourth embodiment of the present invention. Two series resonators $S_1$ and $S_2$ and two parallel resonators $P_1$ and $P_2$ are disposed on a base substrate 2a. A cap 20 is attached to the base substrate 2a from above so as to hermetically cover the resonators $S_1$, $S_2$, $P_1$ and $P_2$. The base substrate 2a, shown schematically in FIG. 10, is formed by stacking atop one another a connection substrate 3a (shown in FIGS. 12A–12C) and a connection substrate 3b (shown in FIGS. 13A–13C), as shown in FIGS. 11 and 14.

As shown in FIG. 18, the piezoelectric filter 1a includes unit filter circuits arranged in two stages, one of which is composed of the series resonator $S_1$ and the parallel resonator $P_1$ connected in the form of the letter L and the other of which is composed of the series resonator $S_2$ and the parallel resonator $P_2$ connected in the form of the letter L. The configuration of the piezoelectric filter 1a will next be described in detail.

As shown in FIGS. 12A–12C, the upper connection substrate 3a of the base substrate 2a is formed of a 6 mm×6 mm square insulating substrate having a thickness of about 0.3 mm. Four through-holes 4a, 4b, 4c and 4d are formed in the upper connection substrate 3a and arranged in line. The through-holes 4a, 4b, 4c and 4d are filled with conductive material 5 such that the conductive material 5 slightly projects from the surface of the upper connection substrate 3a as shown in FIG. 14 to thereby establish point contact with a lower electrode of each resonator at the node position.

At a location near a side of the upper connection substrate 3a is formed an elongated common path layer 18, which runs parallel to the series of through-holes. The common path layer 18 has three circular connection points 19 to which bonding wires 30a, 30b and 30c are connected. Also, a through-hole 4e is formed at a position corresponding to the position of the through-hole 4d. The circular connection points 19 and the through-hole 4e are arranged along one direction at a constant interval.

Furthermore, a conductive edge portion 7, which is formed of a conductive material having a width of about 0.6 mm, is formed on the surface of the upper connection substrate 3a along four side edges of the substrate.

Figure 13A:
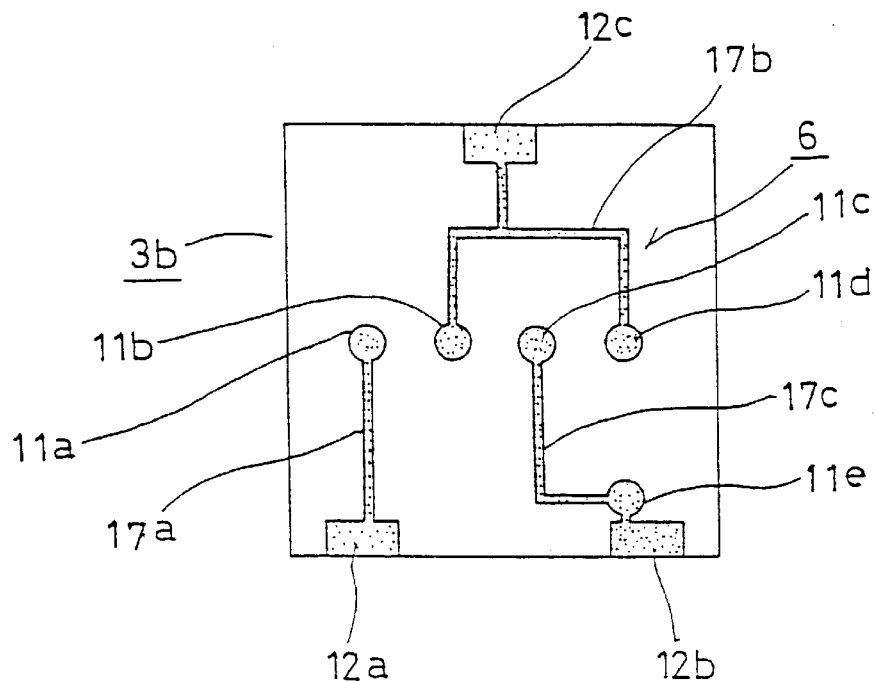
FIG. 13A is a plan view of the lower connection substrate of FIG. 11.
Figure 13B:
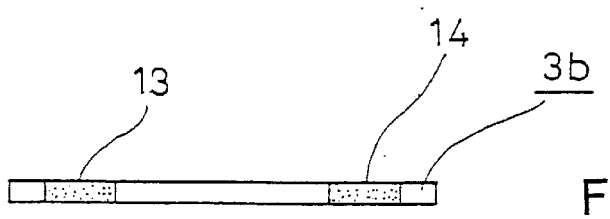
FIG. 13B is a side view of the lower connection substrate of FIG. 11.
Figure 13C:
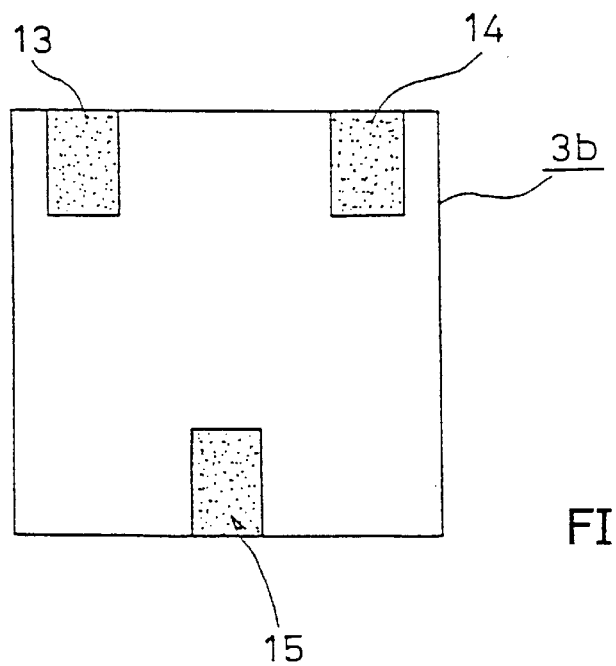
FIG. 13C is a bottom view of the lower connection substrate of FIG. 11.
Figure 14:
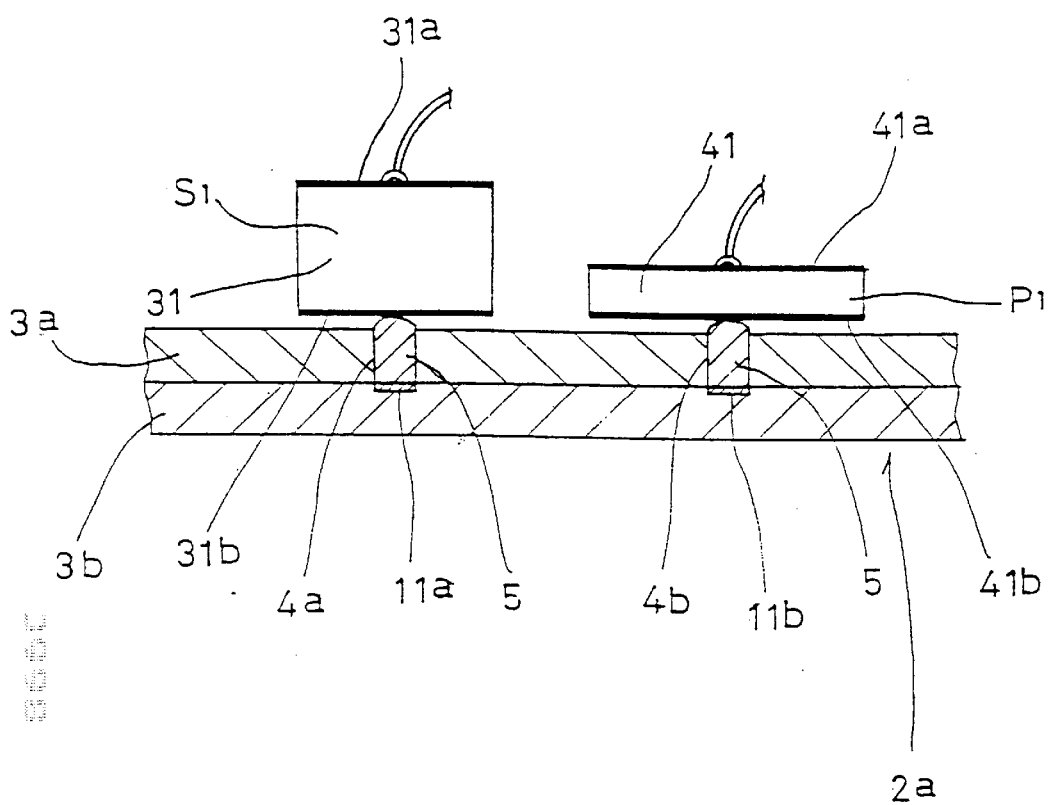
FIG. 14 is a partial vertical cross section of the multielement-type piezoelectric filter of FIG. 10.

As shown in FIGS. 13A–13C, a conduction circuit 6 is formed on the surface of the lower connection substrate 3b in order to establish connection to the resonators in a required form. Specifically, four spot-like connection end portions 11a, 11b, 11c and 11d are formed in line at the central portion of the lower connection substrate 3b for connecting with the through-holes 4a, 4b, 4c and 4d. A rectangular input-side conductive edge portion 12a, a rectangular output-side conductive edge portion 12b and a rectangular ground-side conductive edge portion 12c are formed at the side edge portions of the lower connection substrate 3b. The connection end portion 11a is connected to the input-side conductive edge portion 12a via a thin connection path 17a; the connection end portions 11b and 11d are connected to the ground-side conductive edge portion 12c via a thin connection path 17b; and the connection end portion 11c is connected to the output-side conductive edge portion 12b via a thin connection path 17c. At the base end of the connection path 17c, a circular connection end portion 1ie is provided which is connected to the above-described through-hole 4e. Thus, the conduction circuit 6 is formed on the obverse surface of the lower connection substrate 3b.

On the reverse side of the lower connection substrate 3b, an input terminal portion 13 and an output terminal portion 14 are formed along one side edge of the lower connection substrate 3b, and a ground terminal portion 15 is formed along the opposite side edge of the lower connection substrate 3b. The input terminal portion 13, the output terminal portion 14 and the ground terminal portion 15 extend toward the obverse side of the lower connection substrate 3b along the respective side edges and merge with the input-side conductive edge portion 12a, the output-side conductive edge portion 12b and the ground-side conductive edge portion 12c, respectively. Thus, the connection end portion 11a is connected to the input terminal portion 13 via the thin connection path 17a and the input-side conductive edge portion 12a; the connection end portion 11b and 11d are connected to the ground terminal portion 15 via the thin connection path 17b and the ground-side conductive edge portion 12c; and the connection end portion 11c is connected to the output terminal portion 14 via the thin connection path 17c and the output-side conductive edge portion 12b.

The thus-configured upper and lower connection substrates 3a and 3b, respectively, are stacked atop one another. As a result, the through-hole 4a is connected to the input terminal portion 13 via the connection end portion 11a; the through-holes 4b and 4d are connected to the ground terminal portion 15 via the connection end portions 11b and 11d; and the through-holes 4c and 4e are connected to the output terminal portion 14 via the connection end portions 11c and 11e.

Figure 15:
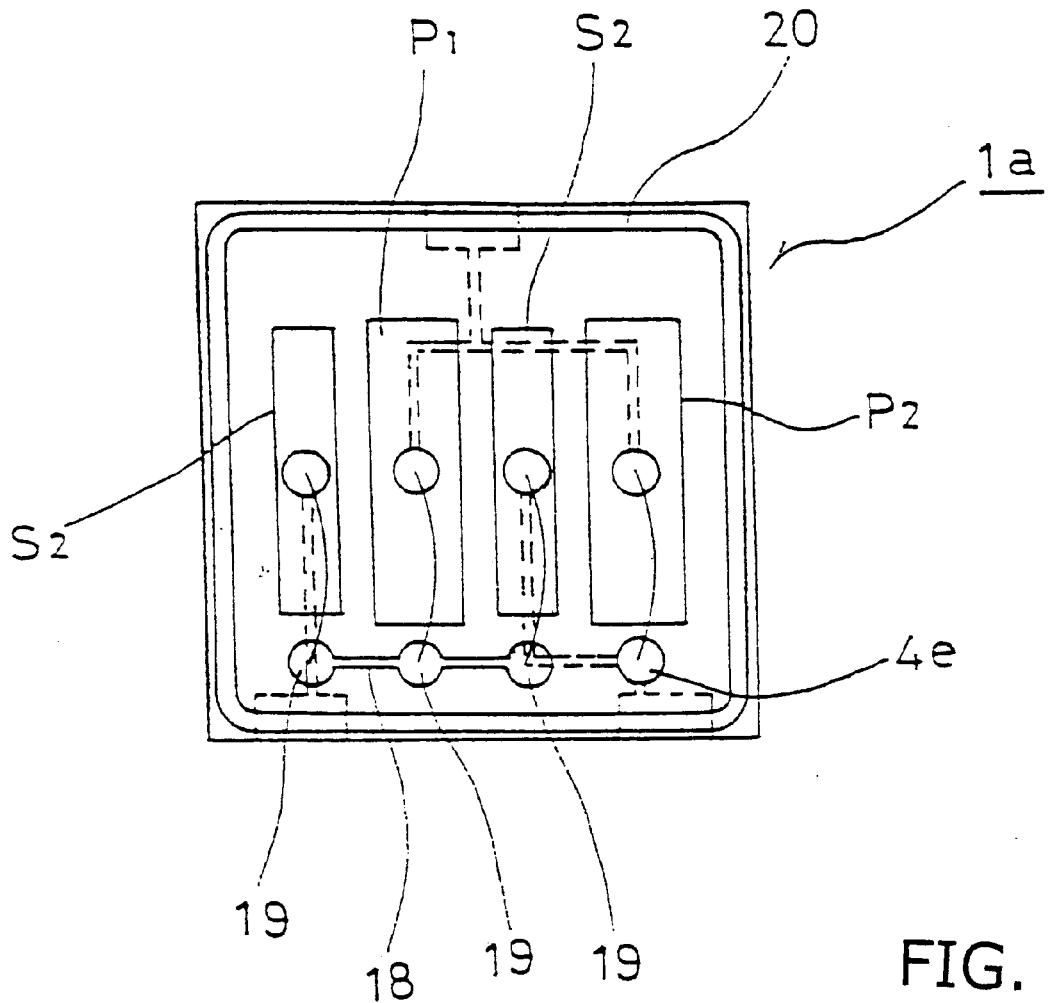
FIG. 15 is a horizontal cross section taken along line A—A of FIG. 10.

As shown in FIGS. 11 and 15, the series resonators $S_1$ and $S_2$ and the parallel resonators $P_1$ and $P_2$ are disposed in line on the base substrate 2a having the above-described structure such that the series resonators $S_1$ and $S_2$ are located on the through-holes 4a and 4c, respectively, and the parallel resonators $P_1$ and $P_2$ are located on the through-holes 4b and 4d, respectively.

Each of the series resonators $S_1$ and $S_2$ includes a strip-like piezoelectric ceramic plate 31 formed of lead zirconate titanate or the like and having a predetermined thickness, and electrodes 31a (hereinafter referred to as upper electrode 31a) and 31b (hereinafter referred to as lower electrode 31b) provided on the obverse and reverse sides, respectively, of the piezoelectric ceramic plate 31. As in the case of the series resonators $S_1$ and $S_2$, each of the parallel resonators $P_1$ and $P_2$ includes a strip-like piezoelectric ceramic plate 41 formed of lead zirconate titanate or the like and electrodes 41a (hereinafter referred to as upper electrode 41a) and 41b (hereinafter referred to as lower electrode 41b) provided on the obverse and reverse sides, respectively, of the piezoelectric ceramic plate 41. The parallel resonators $P_1$ and $P_2$ are made thinner than the series resonators $S_1$ and $S_2$ to thereby provide a larger capacitance. As a result, the ratio of the capacitance of the parallel resonators $P_1$ and $P_2$ to that of the series resonators $S_1$ and $S_2$ becomes large, to thereby increase the degree of attenuation.

The conductive material 5 filled in each of the through-holes 4a, 4b, 4c and 4d is projected upward. Thus, as shown in FIG. 14, the conductive material 5 establishes point contact with each of the lower electrodes 31b and 41b at a node position corresponding to the central position of the corresponding resonator. A fine gap is formed between the remaining region of the lower electrode 31b (41b) and the surface of the base substrate 2a. Accordingly, efficient resonance is ensured.

Furthermore, the first ends of bonding wires 30a, 30b and 30c are each joined, by soldering or the like, to the upper electrodes of the series resonator $S_1$, the parallel resonator $P_1$ and the series resonator $S_2$ at their node positions (center positions), while the second ends of bonding wires 30a, 30b and 30c are each joined to the circular contact points 19 of the common path layer 18. Thus, the electric potentials of the upper electrodes 31a, 41a and 31a of the resonators $S_1$, $P_1$ and $S_2$ are equalized. Furthermore, opposite ends of the bonding wire 30d are respectively soldered to the upper electrode of the parallel resonator $P_2$ and the through-hole 4e. Thus, the upper electrode is connected to the output terminal portion 14.

Because the circular connection points 19 and the through-holes 4e are aligned along one direction at constant intervals, the connection positions of the bonding wires 30a–30d on the resonators and the connection positions at the other ends are located at constant intervals and at the same widthwise positions. Accordingly, when the bonding wires 30a–30d are mechanically soldered using a wire connecting apparatus, rotation of the upper connection substrate 3a is not required. Instead, the bonding wires 30a–30d can be successively joined to the electrodes and the common path layer in the same posture while the upper connection substrate 3a is intermittently fed in one direction. Therefore, the work efficiency is improved. As described above, a considerable manufacturing benefit can be attained by employing a structure in which the common path layer 18 is formed on the upper connection substrate 3a, and the upper electrodes 31a and 41a of the series resonator $S_1$, the parallel resonator $P_1$, and the series resonator $S_2$ are mutually connected via the common path layer 18.

After the above-described connections are made, the cap 20 is attached to the base substrate 2a such that the lower end of a peripheral wall of the cap 20 is bonded to the peripheral portion of the upper surface of the base substrate 2a, to thereby hermetically seal the interior of the cap.

The above-described configuration is represented by the equivalent circuit of FIG. 18. That is, a two-stage filter circuit is formed in which the series resonator $S_1$ and the parallel resonator $P_1$ are connected in the form of the letter L and in which the series resonator $S_2$ and the parallel resonator $P_2$ are connected in the form of the letter L. Specifically, the electrodes of the series resonator $S_1$, the parallel resonator $P_1$ and the series resonator $S_2$ which face each other on the equivalent circuit are mutually connected via the common path layer 18. The lower electrode 31b of the series resonator $S_1$ is connected to the input terminal portion 13, which is formed in an exposed state on the lower surface of the base substrate 2a, via the through-hole 4a, the connection end portion 11a, the connection path 17a and the input-side conductive edge portion 12a. The lower electrode 31b of the series resonator $S_2$ is connected to the output terminal portion 14, which is formed in an exposed state on the lower surface of the base substrate 2a, via the through-hole 4c, the connection end portion 11c and the output-side conductive edge portion 12b. The upper electrode of the parallel resonator $P_2$ is connected to the output terminal portion 14 via the through-hole 4e and the output-side conductive edge portion 12b.

Furthermore, the lower electrodes 41b of the parallel resonators $P_1$ and $P_2$ are connected to the ground terminal portion 15, which is formed in an exposed state on the lower surface of the base substrate 2a, via the through-holes 4b and 4d, the connection end portions 11b, and the ground-side conductive edge portion 12c. Thus, the two-stage filter circuit of FIG. 18 is configured.

In the above-described configuration, the conduction circuit 6 is formed on the lower connection substrate 3b. Therefore, even if the resonators are disposed on the upper connection substrate 3a, no conductive path is exposed on the surface of the base substrate 2a, thereby reliably establishing electrical insulation.

Especially, because the connection between the conduction circuit 6 and the respective terminal portions 13, 14 and 15 is established using only the through-holes 4a–4e, no conduction surface is exposed on the side edge of the upper connection substrate 3a. Accordingly, after assembly, only the terminal portions 13, 14 and 15 are exposed on the reverse surface, so that erroneous connection with an external electrical path is prevented.

Also, because the conduction circuit 6 for establishing a required electrical connection is formed underneath the region on which the resonators are disposed, there is no need for preparing a separate region for the conduction circuit 6 on the upper surface of the base substrate 2a. Thus, the plane area of the base substrate 2a decreases, thereby reducing the overall size of the piezoelectric filter. Furthermore, the conductive material 5 projecting from the through-holes 4a, 4b, 4c and 4d establishes point contact with the corresponding resonators at the node positions of the resonators, and the remaining surface of each of the resonators does not contact the base substrate 2a. Thus, there is no concern of degrading the attenuation characteristics.

The thus-configured piezoelectric filter 1a is mounted on a printed wiring board such that the input terminal portion 13, the output terminal portion 14 and the ground terminal portion 15, which are exposed on the lower surface of the base substrate 2a, are connected to the corresponding conductive paths formed on the printed wiring board.

Figure 16:
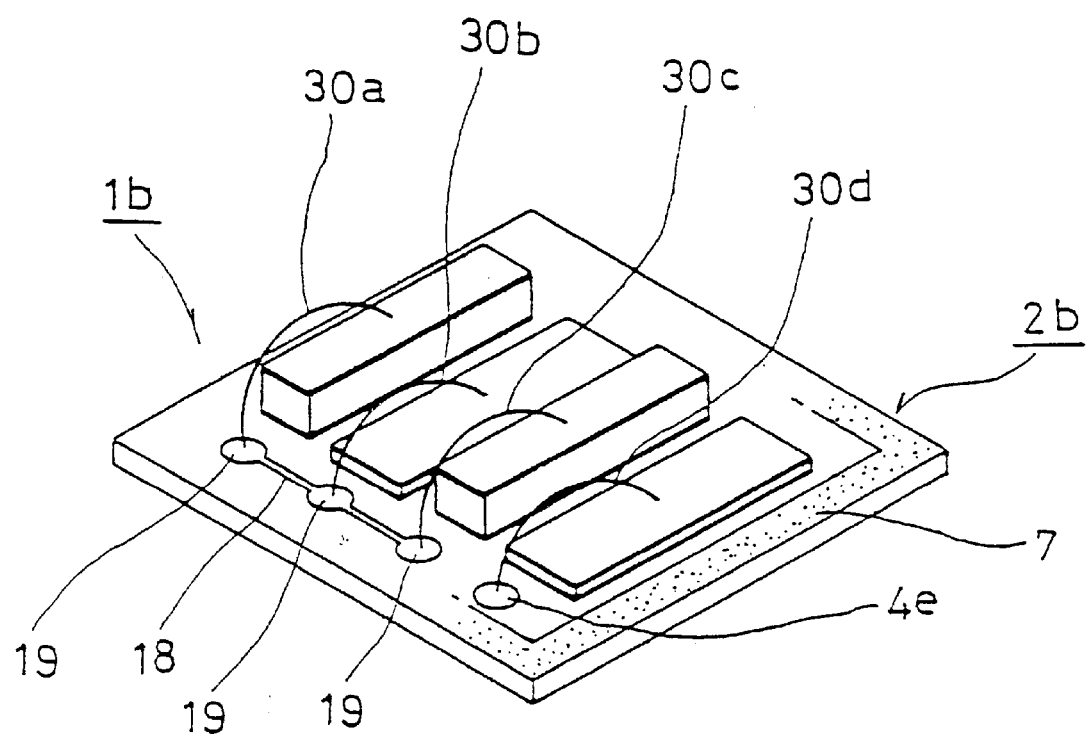
FIG. 16 is a schematic view showing a multielement-type piezoelectric filter according to a fifth embodiment of the present invention.
Figure 17A:
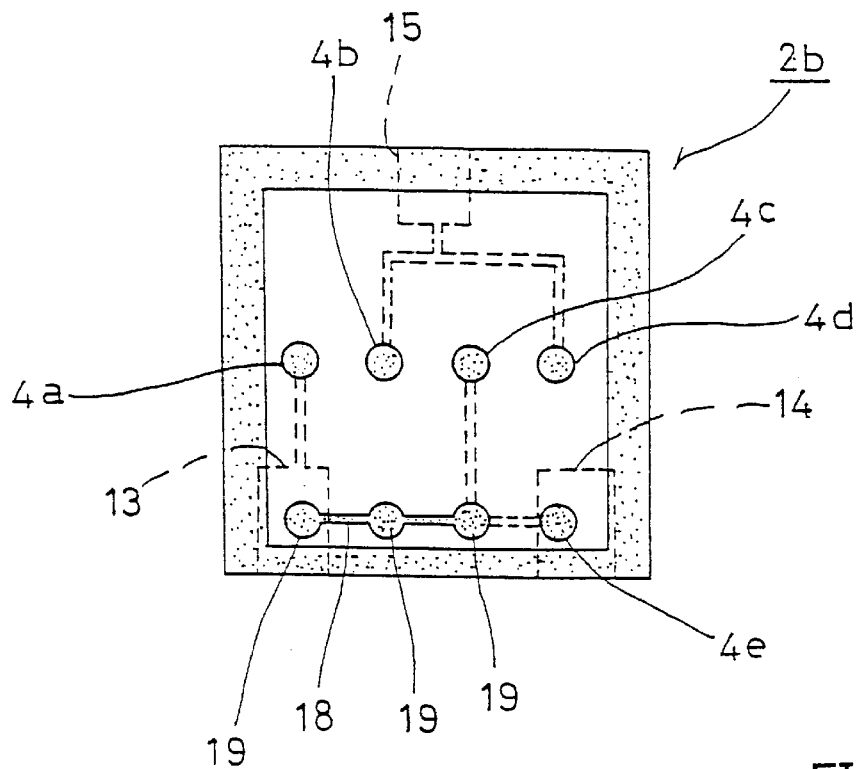
FIG. 17A is a plan view of the base substrate of the multielement-type piezoelectric filter of FIG. 16.
Figure 17B:
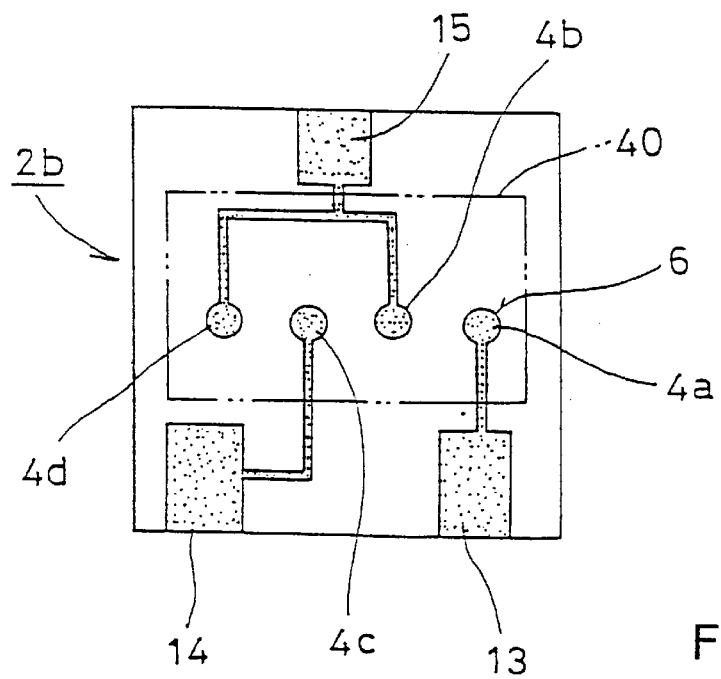
FIG. 17B is a bottom view of the base substrate of the multielement-type piezoelectric filter of FIG. 16.

FIGS. 16, 17A and 17B show a multielement-type piezoelectric filter 1b which employs a base substrate 2b formed of a single connection substrate in accordance with a fifth embodiment of the present invention. The circuit configuration of the base substrate 2b is basically similar to that of the base substrate 2a of FIG. 11 described above. Therefore, the same structural components as those of the base substrate 2a are denoted by common reference numerals, and their description is omitted.

As shown in FIG. 17A, four through-holes 4a, 4b, 4c and 4d are formed in the base substrate 2b and arranged in line. The through-holes 4a, 4b and 4c are filled with a conductive material. As in the case of FIG. 14, the conductive material slightly projects from the surface of the base substrate 2b. Furthermore, the common path layer 18 and the through-hole 4e are also formed.

As shown in FIG. 17B, on the reverse side of the base substrate 2b are formed a conduction circuit 6 for connecting the resonators in a desired manner, as well as an input terminal portion 13, an output terminal portion 14 and a ground terminal portion 15. The through-holes 4a, 4b, 4c and 4d are connected to the input terminal portion 13, the output terminal portion 14 and the ground terminal portion 15 via the conduction circuit 6. Furthermore, an insulating coating layer 40 is formed on the conduction circuit 6 in order to insulate the conduction circuit 6, and to prevent exposure of the conduction circuit 6 from the lower surface.

As shown in FIG. 16, on the base substrate 2b having the above-described structure, there are disposed in line the series resonators $S_1$ and $S_2$ and the parallel resonators $P_1$ and $P_2$ such that the series resonators $S_1$ and $S_2$ and the parallel resonators $P_1$ and $P_2$ are located on the through-holes 4a, 4b, 4c and 4d, respectively.

Furthermore, as in the case of FIG. 10, bonding wires 30a–30d are connected to the series resonators $S_1$ and $S_2$ and the parallel resonators $P_1$ and $P_2$. Subsequently, the cap 20 is attached to the base substrate 2b, thereby forming the two-stage filter circuit of FIG. 18.

As described above, in accordance with the above third and fourth aspects of the present invention, the base substrate 2a (2b) carries the conduction circuit 6. The input terminal portion 13, the output terminal portion 14 and the ground terminal portion 15 are formed on the bottom surface of the base substrate 2a (2b) and are connected to the corresponding connection end portions of the conduction circuit 6. Furthermore, the series resonators $S_1$ and $S_2$ and the parallel resonators $P_1$ and $P_2$ are arranged side by side on the base substrate 2a (2b) in the following manner: the lower electrodes 31b and 41b of the resonators are connected to the corresponding connection end portions of the conduction circuit 6 via through-holes 4a, 4b, 4c and 4d; the common path layer 18 is formed on the base substrate 2a (2b); and the upper electrodes of the resonators $S_1$, $P_1$ and $S_2$ are connected to the common path layer 18 via the bonding wires 30a–30c. Also, the cap is attached to the base substrate 2a (2b) so as to cover the resonators. Thus, the third and fourth aspects of the present invention provide the following advantages.

1) In the configuration wherein the two connection substrates 3a and 3b constitute the base substrate 2a and wherein the conduction circuit 6 is disposed between the two connection substrates 3a and 3b, the conduction circuit 6 is completely concealed and is thus electrically insulated in a reliable manner. Therefore, the configuration is free of electrical short circuits which would otherwise occur due to entry of moisture or the like, thereby improving circuit reliability.

2) In the configuration wherein a single connection substrate constitutes the base substrate 2b, wherein the conduction circuit 6 is disposed on the reverse side of the base substrate 2b and the conduction circuit 6 is covered with the insulating coating layer 40, the structure becomes relatively simple. Also, one connection substrate is omitted as compared to the configuration of 1) above, thereby reducing cost and reducing height by the thickness of the omitted substrate.

3) There is no need for preparing a separate circuit region for establishing a required electrical connection on the upper surface of the base substrate. Thus, the plane area of the base substrate decreases, thereby reducing the overall size of the piezoelectric filter.

4) Because the through-holes 4a, 4c, 4b and 4d contact the resonators $S_1$, $S_2$, $P_1$ and $P_2$, respectively, at node positions, point contact is established at the node positions between the resonators and the corresponding connection end portions of the conduction circuit. As a result, deterioration of the attenuation characteristics can be prevented.

5) In the structure in which the circular connection points 19 formed on the common path layer 18 of the upper connection substrate 3a and the through-hole 4e are disposed in line along the resonators at a constant interval, and the circular connection points 19 and the through-hole 4e are connected to the upper electrodes of the resonators via the bonding wires 30a–30d, the connection positions of the bonding wires 30a–30d on the resonators and the connection positions at the other ends are located at constant intervals and at the same widthwise positions. Accordingly, when the bonding wires are mechanically soldered using a wire connecting apparatus, rotation of the upper connection substrate or base substrate is not required. Instead, the bonding wires can be successively joined to the electrodes and the common path layer in the same posture while the upper connection substrate is intermittently fed in one direction. Therefore, the working efficiency is improved.

While the invention has been described in detail and with reference to specific embodiments thereof, it will be apparent to one skilled in the art that various changes and modifications can be made therein without departing from the spirit and scope thereof.

What is claimed is:

1. A multielement-type piezoelectric filter comprising:

a base substrate comprising upper and lower connection substrates stacked atop one another; a conduction circuit having connection end portions formed on a mating surface of the upper and lower connection substrates; an input terminal portion, an output terminal portion and a ground terminal portion formed on a bottom surface of the base substrate and connected to corresponding connection end portions of the conduction circuit;

series resonators and parallel resonators having lower and upper electrodes arranged side by side on the base substrate, wherein the lower electrodes are connected to corresponding connection end portions of the conduction circuit via through-holes containing a conductive material formed in the upper connection substrate;

a flexible conductive sheet attached to exposed upper electrodes of some of the resonators so as to establish a required connection between these upper electrodes; and a cap attached to the base substrate which covers the resonators.

2. A multielement-type piezoelectric filter according to claim 1, wherein two parallel resonators, each having approximately half the thickness of each of the series resonators, are stacked atop one another so as to obtain a total height which is substantially equal to the height of each of the series resonators; the thus-stacked parallel resonators and the series resonators are arranged side by side; and said flexible conductive sheet is attached to the exposed upper electrodes of the resonators so as to establish a required connection between the upper electrodes.

3. A multielement-type piezoelectric filter according to claim 1, wherein the series resonators have a height that is different from that of the parallel resonators as arranged on the base substrate; and said flexible conductive sheet attached to exposed upper electrodes of some of the resonators is bent in accordance with the difference in height between the series resonators and the parallel resonators so as to establish a required connection between the upper electrodes.

4. A multielement-type piezoelectric filter comprising:

a base substrate formed of a single connection substrate including a conduction circuit having connection end portions, an input terminal portion, an output terminal portion and a ground terminal portion formed on a reverse side of the base substrate, wherein said input, output and ground terminal portions are connected to corresponding connection end portions of the conduction circuit;

series resonators and parallel resonators having lower and upper electrodes arranged side by side on an obverse side of the base substrate, wherein the lower electrodes are connected to corresponding connection end portions of the conduction circuit via through-holes containing a conductive material formed in the base substrate;

a flexible conductive sheet attached to exposed upper electrodes of some of the resonators so as to establish a required connection between these upper electrodes;

an insulating coating layer for covering the conduction circuit provided on the reverse side of the base substrate; and a cap attached to the base substrate which covers the resonators.

5. A multielement-type piezoelectric filter according to claim 4, wherein the series resonators have a height that is different from that of the parallel resonators as arranged on the base substrate; and said flexible conductive sheet attached to exposed upper electrodes of some of the resonators is bent in accordance with the difference in height between the series resonators and the parallel resonators so as to establish a required connection between the upper electrodes.

6. A multielement-type piezoelectric filter according to claim 4, wherein two parallel resonators, each having approximately half the thickness of each of the series resonators, are stacked atop one another so as to obtain a total height which is substantially equal to the height of each of the series resonators; the thus-stacked parallel resonators and the series resonators are arranged side by side; and said flexible conductive sheet is attached to the exposed upper electrodes of the resonators so as to establish a required connection between the upper electrodes.

7. A multielement-type piezoelectric filter comprising:

a base substrate comprising upper and lower connection substrates stacked atop one another; a conduction circuit having connection end portions formed on a mating surface of the upper and lower connection substrates; an input terminal portion, an output terminal portion and a ground terminal portion formed on a bottom surface of the base substrate and connected to corresponding connection end portions of the conduction circuit;

series resonators and parallel resonators having lower and upper electrodes arranged side by side on the base substrate, wherein the lower electrodes are connected to corresponding connection end portions of the conduction circuit via through-holes containing a conductive material formed in the upper connection substrate;

a common path layer having connection points formed on an upper surface of the base substrate, the upper electrodes of some of the resonators being electrically connected to connection points of the common path layer via bonding wires so as to establish a mutual connection between these upper electrodes; and a cap attached to the base substrate which covers the resonators.

8. A multielement-type piezoelectric filter according to claim 7, wherein the upper electrodes of some of the resonators are electrically connected to connection points of the common path layer via bonding wires, the upper electrode of a resonator other than those resonators having an upper electrode electrically connected to a connection point of the common path layer is electrically connected via a bonding wire to an additional through-hole containing a conductive material formed in the upper connection substrate, and said connection points of the common path layer and said additional through-hole are disposed in line along the resonators at a constant interval.

9. A multielement-type piezoelectric filter comprising:

a base substrate formed of a single connection substrate and including a conduction circuit having connection end portions, an input terminal portion, an output terminal portion and a ground terminal portion formed on a reverse side of the base substrate, wherein the input, output and ground terminal portions are connected to corresponding connection end portions of the conduction circuit;

series resonators and parallel resonators having lower and upper electrodes arranged side by side on an obverse side of the base substrate, wherein the lower electrodes are connected to corresponding connection end portions of the conduction circuit via through-holes containing a conductive material formed in the base substrate;

a common path layer having connection points formed on the obverse surface of the base substrate, the upper electrodes of some of the resonators being electrically connected to the connection points of the common path layer via bonding wires so as to establish a mutual connection between these upper electrodes;

an insulating coating layer for covering the conduction circuit provided on the reverse side of the base substrate; and a cap attached to the base substrate which covers the resonators.

10. A multielement-type piezoelectric filter according to claim 9, wherein the upper electrodes of some of the resonators are electrically connected to connection points of the common path layer via bonding wires, the upper electrode of a resonator other than those resonators having an upper electrode electrically connected to a connection point of the common path layer is electrically connected via a bonding wire to an additional through-hole containing a conductive material formed in the base substrate, and said connection points of the common path layer and said additional through-hole are disposed in line along the resonators at a constant interval.

* * * * *